(12) United States Patent
Sato et al.

(10) Patent No.: US 7,012,295 B2
(45) Date of Patent: Mar. 14, 2006

(54) SEMICONDUCTOR MEMORY WITH PERIPHERAL TRANSISTORS HAVING GATE INSULATOR THICKNESS BEING THINNER THAN THICKNESS OF MEMORY AND SELECT TRANSISTORS

(75) Inventors: Atsuhiro Sato, Kanagawa (JP); Makoto Sakuma, Kanagawa (JP); Fumitaka Arai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/878,372

(22) Filed: Jun. 29, 2004

(65) Prior Publication Data

US 2005/0029573 A1 Feb. 10, 2005

(30) Foreign Application Priority Data

Jul. 4, 2003 (JP) ............................. 2003-192491

(51) Int. Cl.
*H01L 29/788* (2006.01)
(52) U.S. Cl. ...................... 257/315; 257/257; 257/321; 438/201; 438/257; 365/185.01; 365/185.03
(58) Field of Classification Search ..................... None
See application file for complete search history.

(56) References Cited

U.S. PATENT DOCUMENTS

2005/0141291 A1 * 6/2005 Noguchi et al. ....... 365/189.09

FOREIGN PATENT DOCUMENTS

| JP | 2001-015617 | 1/2001 |
| JP | 2001-168306 | 6/2001 |
| JP | 2001-210809 | 8/2001 |
| JP | 2003-037251 | 2/2003 |

* cited by examiner

*Primary Examiner*—David Nelms
*Assistant Examiner*—Long Tran
(74) *Attorney, Agent, or Firm*—Oblon, Spivak, McClelland, Maier & Neustadt, P.C.

(57) ABSTRACT

The memory cell transistor has a first cell site gate insulator, a first lower conductive layer on the first cell site gate insulator, a first inter-electrode dielectric on the first lower conductive layer, and a first upper conductive layer on the first inter-electrode dielectric. A select transistor has a second cell site gate insulator having a same thickness as the first cell site gate insulator, a second lower conductive layer on the second cell site gate insulator, a second inter-electrode dielectric on the second lower conductive layer, and a second upper conductive layer on the second inter-electrode dielectric. The peripheral transistor has a first peripheral site gate insulator having a thickness thinner than the first cell site gate insulator.

17 Claims, 18 Drawing Sheets

SEMICONDUCTOR MEMORY WITH PERIPHERAL TRANSISTORS HAVING GATE INSULATOR THICKNESS BEING THINNER THAN THICKNESS OF MEMORY AND SELECT TRANSISTORS

CROSS REFERENCE TO RELATED APPLICATIONS

This application claims benefit of priority under 35 USC 119 based on Japanese Patent Application No. P2003-192491 filed Jul. 4, 2003, the entire contents of which are incorporated by reference herein.

BACKGROUND OF THE INVENTION

1. Field of the Invention

The present invention relates to a semiconductor memory. It is particularly related to a miniaturized nonvolatile semiconductor memory encompassing a plurality of cell columns, each of the cell columns embraces serially connected plural memory cells, the cell columns being arranged very close to each other; and a fabrication method thereof.

2. Description of the Related Art

In recent years, usage of an alumina ($Al_2O_3$) film has been proposed for the material of an inter-electrode dielectric 4, which insulates a lower conductive layer (a floating gate electrode) 3 from an upper conductive layer (a control gate electrode) 7 as shown in FIG. 1A. FIG. 1A is a schematic cross sectional view showing part of a memory cell matrix cut along the column-direction, and one of memory cell transistors QCk in a k-th cell column, a select transistor QSGk in the cell column and another select transistor QSGk−1 in adjacent k−1-th column are shown, and FIG. 1B is a schematic cross sectional view showing a part of the memory cell matrix viewed along row-direction on the select transistor QSGk. For the double-polysilicon architecture encompassing a polysilicon floating gate electrode 3 and a polysilicon control gate electrode 7, the inter-electrode dielectric 4 is called "an interpoly dielectric".

FIG. 1C is a schematic cross sectional view showing a peripheral transistor Qp in a peripheral site, cut along the column-direction. In the semiconductor memory having the memory cell transistors QCk implemented by a gate electrode structure, in which a lower conductive layer 3 and an upper conductive layer 7 are stacked via the inter-electrode dielectric 4, by a fabrication method forming a lower conductive layer 3 in a self-alignment methodology with respect to an active region, for both the memory cell site and the peripheral site, stacked structures of a gate insulator 2, the lower conductive layer (floating gate electrode) 3, the inter-electrode dielectric 4, and the upper conductive layer (control gate electrode) 7 can be formed. The gate insulator 2, the lower conductive layer 3, the inter-electrode dielectric 4, and the upper conductive layer 7 are all stacked in this order on the active region. However, in the architecture in which the peripheral transistor Qp belonging to the peripheral site is aligned continuously to an outermost positioned select transistor QSGk in a memory cell site, the problem of how to conductively connect the upper conductive layer (control gate electrode) 7 to the already formed lower conductive layer (floating gate electrode) 3 has become an issue.

A cell site gate insulator 2 requires a film thickness of approximately 10 nm for maintaining memory cell data-retaining characteristics when using a silicon oxide film, for example. Thus, for enhancing the performance of the peripheral transistor Qp of the peripheral site, the thickness of the peripheral site gate insulators 10 is required to be thinner than the thickness of the cell site gate insulators 2.

As a result of such circuit design necessities, in the earlier architecture, for the peripheral transistor Qp of the peripheral site, and for the select transistors QSGk and QSGk−1 in memory cell site, by removing the already formed lower conductive layer (floating gate electrode) 3, and then by exchanging it with new gate insulators, new gate electrodes are fabricated exclusively for the peripheral site and for the select transistors QSGk and QSGk−1. Namely, the peripheral transistor Qp of the peripheral site and the select transistors QSGk and QSGk−1 in the memory cell site, which do not have the lower conductive layer 3, have been separately fabricated from the memory cell transistors QCk in the memory cell site, which have the lower conductive layers 3 as disclosed in Japanese Patent Application Laid-open No. 2001168306.

However, with the earlier semiconductor memory and a fabrication method of the earlier semiconductor memory disclosed in Japanese Patent Application Laid-open No. 2001168306, finer and finer photolithography processes are necessary for removing upper conductive layer (control gate electrode) 7 of the select transistors QSGk and QSGk−1. That is, considering miniaturized dimensions and misalignment margins in photolithography processes for opening windows in the select transistors QSGk and QSGk−1, as well as the misalignment margins in the other photolithography processes for forming the select transistors QSGk and QSGk−1, the fabrication of the miniaturized select transistors QSGk and QSGk−1 becomes very difficult.

SUMMARY OF THE INVENTION

An aspect of the present invention inheres in a semiconductor memory having a memory cell site and a peripheral site disposed around the memory cell site. A memory cell matrix is disposed in the memory cell site, including a plurality of cell columns arranged along a row-direction, each of cell columns is implemented by a plurality of memory cell transistors serially connected along a column direction, and a select transistor arranged along the column-direction, configured to select the memory cell transistors arranged in the cell column. Peripheral circuitry are disposed in the peripheral site, configured to drive the memory cell transistors and select transistors and to read information from the memory cell transistors, each of the peripheral circuitry being implemented by peripheral transistors.

Each of the memory cell transistors has a first gate structure encompassing a first cell site gate insulator, a first lower conductive layer disposed on the first cell site gate insulator, a first inter-electrode dielectric disposed on the first lower conductive layer, and a first upper conductive layer disposed on the first inter-electrode dielectric so that the first upper conductive layer is isolated from the first lower conductive layer by the first inter-electrode dielectric.

The select transistor has a second gate structure encompassing a second cell site gate insulator having a same thickness as the first cell site gate insulator, a second lower conductive layer disposed on the second cell site gate insulator, a second inter-electrode dielectric disposed on the second lower conductive layer, and a second upper conductive tive layer disposed on the second inter-electrode dielectric so that the second upper conductive layer is conducted with the second lower conductive layer by an inter-electrode through-hole formed in the second inter-electrode dielectric.

Furthermore, each of the peripheral transistors has a third gate structure encompassing a first peripheral site gate insulator having a thickness thinner than the first cell site gate insulator.

Another aspect of the present invention inheres in a method for manufacturing a semiconductor memory having a memory cell site and a peripheral site disposed around the memory cell site, a memory cell matrix disposed in the memory cell site includes a plurality of cell columns arranged along a row-direction, peripheral circuitry disposed in the peripheral site being configured to drive the memory cell transistors and select transistors and to read information from the memory cell transistors. Namely, the method encompasses:

(a) forming the cell site gate insulator on the semiconductor substrate;

(b) depositing the lower conductive layer on the cell site gate insulator;

(c) depositing an inter-electrode dielectrics on the lower conductive layers;

(d) opening an inter-electrode through-hole in the inter-electrode dielectric;

(e) depositing an upper conductive layer on the inter-electrode dielectric;

(f) removing selectively the upper conductive layer, the inter-electrode dielectric, the lower conductive layer and the cell site gate insulator at the peripheral site so as to expose a portion of the semiconductor substrate; and (g) forming selectively a peripheral site gate insulator on the exposed portion of the semiconductor substrate, the peripheral site gate insulator having a thickness thinner than the cell site gate insulator.

BRIEF DESCRIPTION OF THE DRAWINGS

Various embodiments of the present invention will be described with reference to the accompanying drawings. It is to be noted that the same or similar reference numerals are coated to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

DETAILED DESCRIPTION OF THE EMBODIMENTS

In the following description specific details are set forth, such as specific materials, process and equipment in order to provide a thorough understanding of the present invention.

It will be apparent, however, to one skilled in the art that the present invention may be practiced without these specific details. In other instances, well-known manufacturing materials, process and equipment are not set forth in detail in order not unnecessary obscure the present invention.

Prepositions, such as "on", "over" and "under" are defined with respect to a planar surface of the substrate, regardless of the orientation in which the substrate is actually held. A layer is on another layer even if there are intervening layers.

(First Embodiment)

Figure 1A:
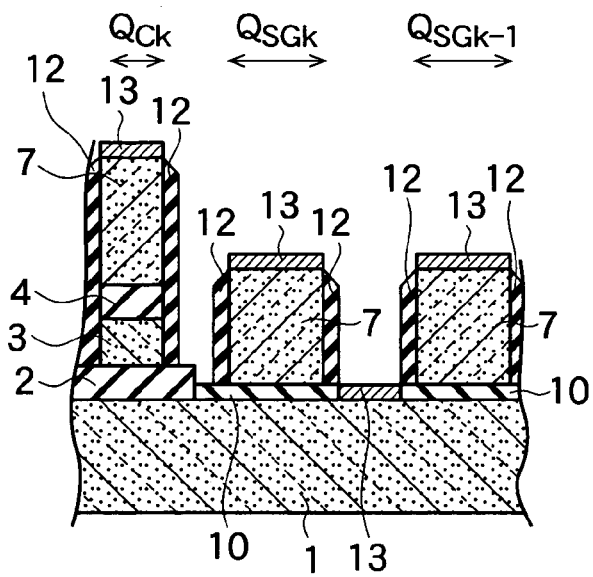
FIGS. 1A, 1B and 1C are schematic cross sectional views showing respectively parts of a memory cell matrix of a earlier semiconductor memory.
Figure 1B:
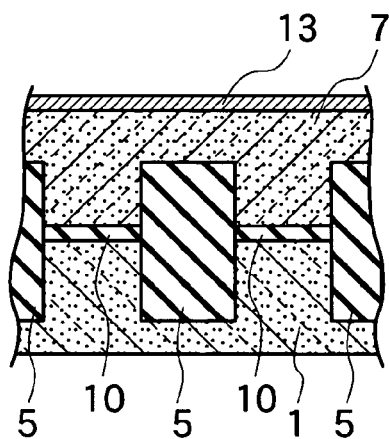
Figure 1C:
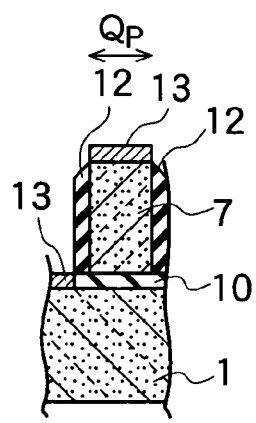
Figure 2:
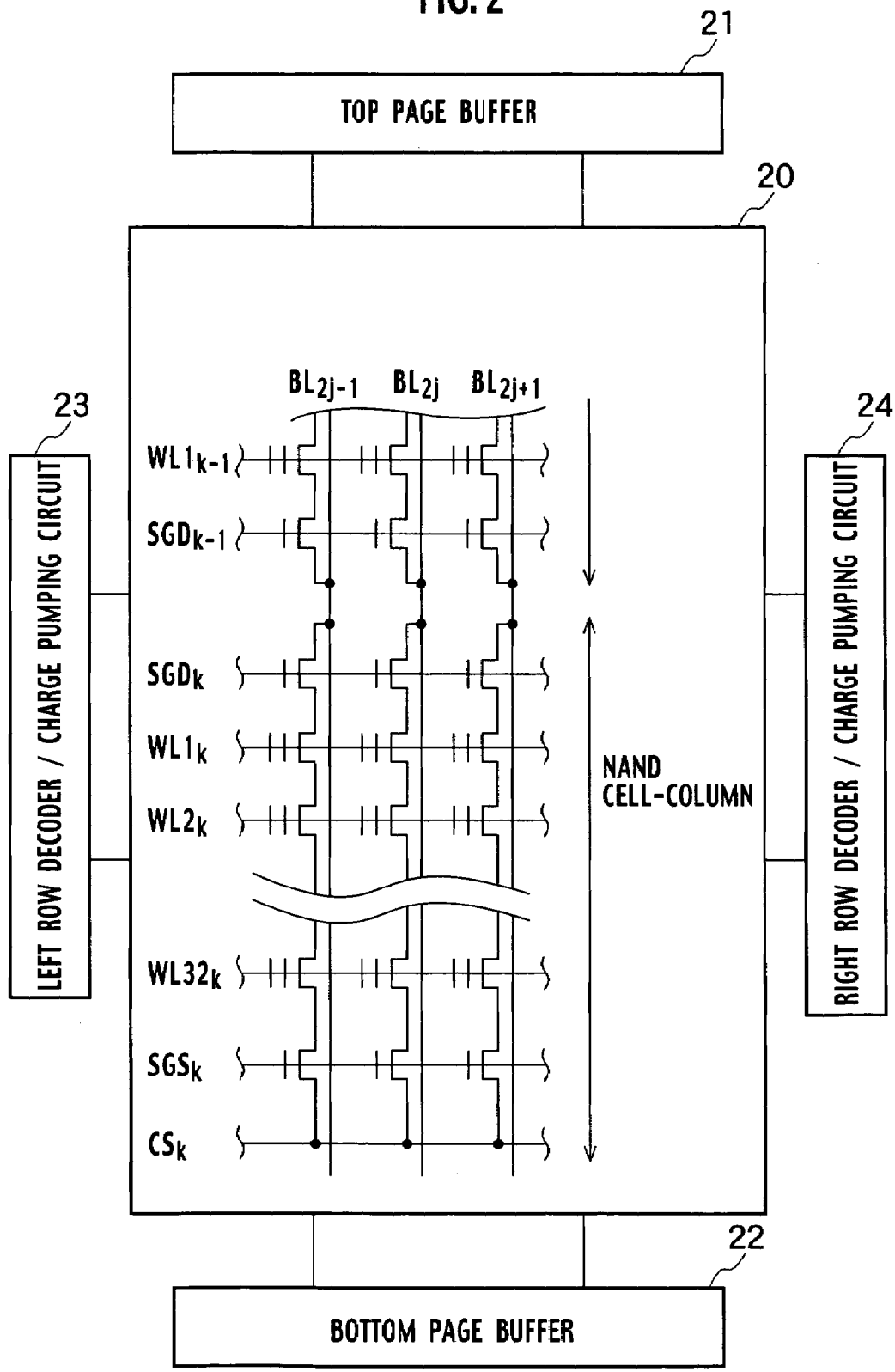
FIG. 2 is a schematic circuit diagram illustrating a semiconductor memory according to a first embodiment of the present invention.

FIG. 2 is a block diagram illustrating a schematic circuitry of NAND flash memory as a semiconductor memory according to a first embodiment of the present invention. Peripheral circuits (21, 22, 23, and 24) such as a top page buffer 21, a bottom page buffer 22, a left row decoder/charge pump 23, and a right row decoder/charge pump 24 are arranged on the periphery of a memory cell matrix 20.

Figure 3:
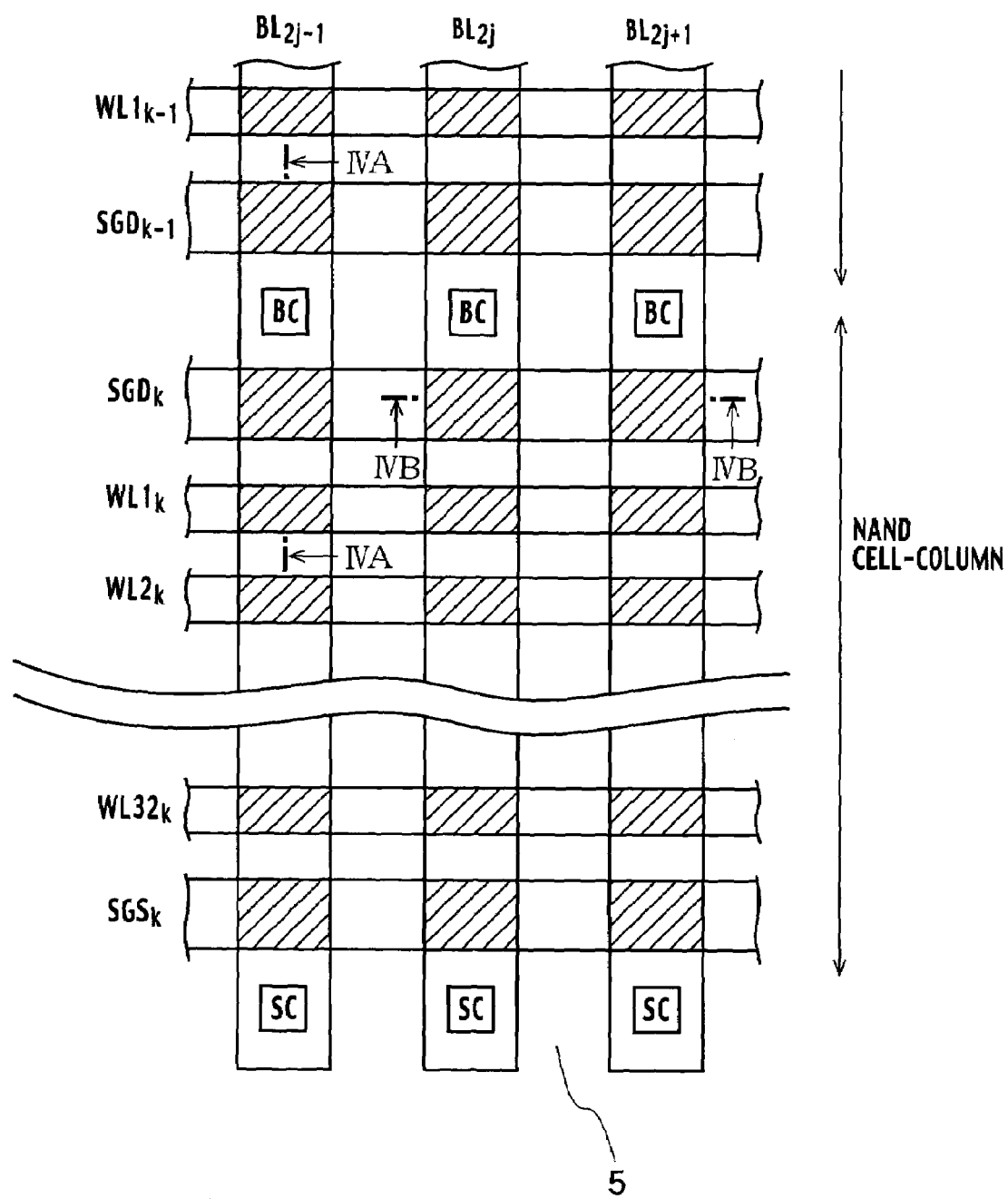
FIG. 3 is a layout pattern structure illustrating part of a memory cell matrix of the semiconductor memory according to the first embodiment of the present invention.

As shown in FIGS. 2 and 3, the memory cell matrix 20 embraces plural cell columns (NAND cell columns) extending along a column-direction, the cell columns are arranged along a row-direction in parallel. Each of cell columns is implemented by plural memory cell transistors serially arranged along the column-direction. Each of the memory cell transistors has a charge accumulation layer whose electric charge accumulation level is configured to be controlled separately. The horizontal lines connected to all the memory cell transistors in corresponding rows are called "the word lines $WL1_k$, $WL2_k$, ..., $WL32_k$, $WL1_{k-1}$, ...". The word lines $WL1_k$ to $WL32_k$ are connected to all the memory cell transistors in plural k-th NAND cell columns, and the word lines $WL1_{k-1}$, ... are connected to all the memory cell transistors in plural k-1-th NAND cell columns. In other words, the semiconductor memory according to the first embodiment of, as shown in FIGS. 2 and 3, encompasses plural word lines $WL1_k$, $WL2_k$, ..., $WL32_k$, $WL1_{k-1}$, ... arranged along the row-direction, and plural bit lines $BL_{2j-1}$, $BL_{2j}$, $BL_{2j+1}$, ... arranged along the column-direction orthogonal to these word lines $WL1_k$, $WL2_k$, ..., $WL32_k$, $WL1_{k-1}$, .... The vertical lines $BL_{2j-1}$, $BL_{2j}$, $BL_{2j+1}$, ..., along which the data flow in and out of the memory cell transistors, are called "bit lines". In addition, memory cell transistors, which have respective charge accumulation layers whose electric charge accumulation levels can be controlled separately using plural word lines $WL1_k$, $WL2_k$, ..., $WL32_k$, $WL1_{k-1}$, ..., are arranged along the row-direction in FIGS. 2 and 3.

FIGS. 2 and 3 illustrate the case where 32 memory cell transistors are arranged along the column-direction so as to implement each of the cell columns. A pair of select transistors, which select a group of memory cell transistors serially arranged in the corresponding cell column, are arranged at both ends of respective cell columns. The plural cell columns are arranged in parallel, close to each other. Upper select gate line $SGD_K$ of the k-th NAND cell columns is connected to the respective gates of upper select transistors of the corresponding k-th NAND cell columns. Lower select gate line $SGS_K$ of the k-th NAND cell columns is connected to the respective gates of the lower select transistors of the corresponding k-th NAND cell columns. Further, lower select gate line $SGD_{K-1}$ of the adjacent k-1-th NAND cell columns is connected to the respective gates of the lower select transistors of the corresponding k-1-th NAND cell columns. The drain electrodes of the upper select transistors of the corresponding k-th NAND cell columns and the lower select transistors of the corresponding k-1-th NAND cell columns are connected to the corresponding bit lines $BL_{2j+1}$, $BL_{2j}$, $BL_{2j+1}$, .... The source electrodes of the upper select transistors of the corresponding k-th NAND cell columns are connected to the drain electrodes of the uppermost memory cell transistor in the corresponding k-th NAND cell columns. The source electrodes of the lower select transistors of the corresponding k-1-th NAND cell columns are connected to the drain electrodes of the lowermost memory cell transistor in the corresponding k-1-th NAND cell columns. The drain electrodes of the lower select transistors of the corresponding k-th NAND cell columns are connected to the source electrodes of the lowermost memory cell transistor in the corresponding k-th NAND cell columns, and the source electrodes of the lower select transistors of the corresponding k-th NAND cell columns are connected to the common source line $CS_K$ of the corresponding k-th NAND cell columns. As it will be appreciated, the terms drain and source can be exchanged without modifying the structure itself.

The top page buffer 21 and the bottom page buffer 22 are respectively connected to the bit lines $BL_{2j-1}$, $BL_{2j}$, $BL_{2j+1}$, .... The top page buffer 21 and the bottom page buffer 22 buffer respectively the cell column information read out respectively from corresponding memory cell transistors. The left row decoder/charge pump 23 and the right row decoder/charge pump 24 are connected to the word lines $WL1_k$, $WL2_k$, ..., $WL32_k$, $WL1_{k-1}$, ..., respectively, and control the electric charge accumulation state of each memory cell transistor implementing the cell column.

Figure 4A:
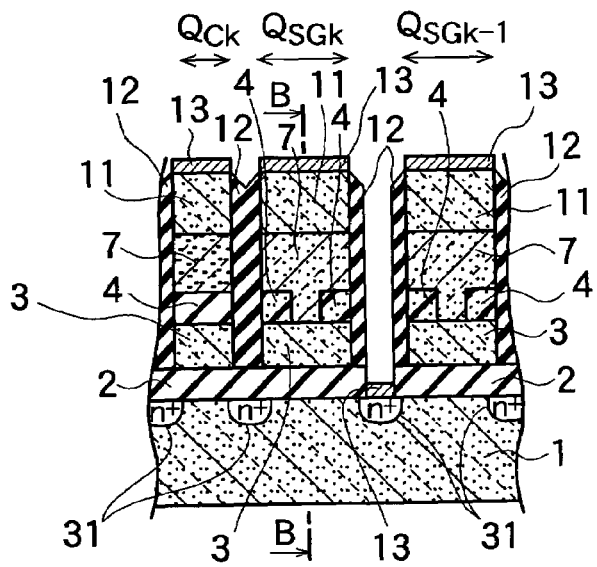
FIG. 4A is a schematic cross sectional view showing a part of the memory cell matrix of a semiconductor memory according to the first embodiment of the present invention taken on line IVA—IVA in FIG. 3, or the cross sectional view cut along a column-direction.
Figure 4B:
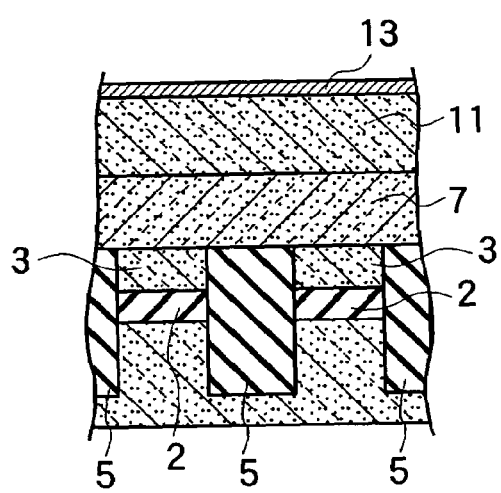
FIG. 4B is a schematic cross sectional view showing a part of the memory cell matrix of the semiconductor memory according to the first embodiment taken on line IVB—IVB in FIG. 4A, or the cross sectional view cut along a row-direction.
Figure 4C:
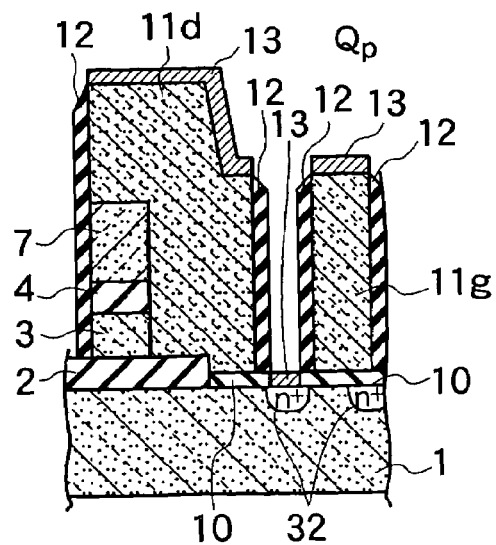
FIG. 4C is a schematic cross sectional view of a peripheral transistor of the semiconductor memory according to the first embodiment, cut along the column-direction.

FIG. 4A is a schematic cross sectional view showing part of the memory cell matrix 20 taken on line IVA—IVA in FIG. 3, or the cross sectional view cut along the length of the bit lines $BL_{2j-1}$, $BL_{2j}$, $BL_{2j+1}$, .... FIG. 4B is a schematic cross sectional view showing part of the memory cell matrix 20 taken on line IVB—IVB in FIG. 4A, and is in accordance with the cross sectional view cut along the length of the word lines $WL1_k$, $WL2_k$, ..., $WL32_k$, $WL1_{k-1}$, .... FIG. 4C is a schematic cross sectional view showing the peripheral transistor Qp of the peripheral circuitry 21, 22, 23 and 24.

As shown in FIG. 4A, a memory cell transistor QCk of the semiconductor memory according to the first embodiment has a first gate structure encompassing a first cell site gate insulator 2, a first lower conductive layer 3 disposed on the first cell site gate insulator 2, a first inter-electrode dielectric 4 disposed on the first lower conductive layer 3, a first upper conductive layer 7 disposed on the first inter-electrode dielectric 4 and a first peripheral conductive layer 11 disposed on the first upper conductive layer 7. The first peripheral conductive layer 11 is adopted for implementing a gate electrode structure of the peripheral transistor Qp in the peripheral site. On the top surface of the first peripheral conductive layer 11, a refractory metal silicide film 13 is formed. The first upper conductive layer 7 is isolated from the first lower conductive layer 3 by the first inter-electrode dielectric 4.

In addition, as shown in FIG. 4A and FIG. 4B, the select transistor QSGk of the k-th cell column and the select transistor QSGk-1 of the k-1-th cell column respectively have second gate structures, each encompassing a second cell site gate insulator 2 having a same thickness as the first cell site gate insulator 2, a second lower conductive layer 3 disposed on the second cell site gate insulator 2, a second inter-electrode dielectric 4 disposed on the second lower conductive layer 3, a second upper conductive layer 7 disposed on the second inter-electrode dielectric 4 and a second peripheral conductive layer 11 disposed on the second upper conductive layer 7. Similar to the first peripheral conductive layer 11, the second peripheral conductive layer 11 is adopted for the gate electrode structure of the peripheral transistor Qp in the peripheral site. On the top surface of the second peripheral conductive layer 11, a refractory metal silicide film 13 is formed.

The thickness of the second lower conductive layer 3, the second inter-electrode dielectric 4 and the second upper conductive layer 7 are same as the thickness of the first lower conductive layer 3, the first inter-electrode dielectric 4 and the first upper conductive layer 7, respectively. Each of the second upper conductive layer 7 of the select transistors QSGk and QSGk−1 is conducted with the second lower conductive layer 3 by an inter-electrode through-hole formed in the second inter-electrode dielectric 4 as shown in FIG. 4A. Or the select transistors QSGk and QSGk−1 are electrically connected between the second upper conductive layer 7 and the second lower conductive layer 3 via inter-electrode through-holes 41 (see FIG. 7A) of the respective second inter-electrode dielectrics 4.

Peripheral circuitries 21 (Top Page Buffer), 22 (Bottom Page Buffer), 23 (Left Row Decoder/Charge Pumping Circuit), and 24 (Right Row Decoder/Charge Pumping Circuit) have peripheral transistors Qp. Each of the peripheral transistors have a third gate electrode structure, which is implemented by a first peripheral site gate insulator 10 having a thickness thinner than the first cell site gate insulator 2, as shown in FIG. 4C. In addition, as shown in FIG. 4C, a dummy gate electrode (a third peripheral conductive layer) 11d, which corresponds to the first and second peripheral conductive layers 11 shown in FIGS. 4A and 4B and has a structure linking the second gate electrode structure of the select transistors QSGk and QSGk−1 and the third gate electrode structure of the peripheral transistor Qp, is arranged in interface regions between the memory cell matrix 20 and each peripheral circuitry 21, 22, 23, and 24. The third gate electrode structure of the peripheral transistor Qp is implemented by a gate electrode 11g made from a single layer of conductive material, which is the same material as the dummy gate electrode 11d. The gate electrode 11g is isolated from the dummy gate electrode 11d. On the top surface of the dummy gate electrode 11d and the gate electrode 11g, refractory metal silicide films 13 are formed.

That is, the dummy gate electrode 11d encompasses a third cell site gate insulator 2 having a same thickness as the first cell site gate insulator 2, a second peripheral site gate insulator 10 having a same thickness as the first peripheral site gate insulator 10, a third lower conductive layer 3 disposed on the third cell site gate insulator 2, a third inter-electrode dielectric 4 disposed on the third lower conductive layer 3, a third upper conductive layer 7 disposed on third inter-electrode dielectric 4, and a third peripheral conductive layer lid extending from the top surface of the third upper conductive layer 7 to the top surface of the second peripheral site gate insulator 10. The third peripheral conductive layer 11d cover a step defined between the top surfaces of the third upper conductive layer 7 and the second peripheral site gate insulator 10.

More specifically, a plurality of tunnel oxide films, which becomes first to third cell site gate insulators 2, is sandwiched between the semiconductor substrate 1 and the first to third cell site gate insulators 2, and the plural first to third lower conductive layers (floating gate electrodes) 3 are arranged close to each other on the corresponding first to third cell site gate insulators (tunnel insulating film) 2. Each of the first and second lower conductive layers (floating gate electrodes) 3 has a topology of a rectangular parallelepiped, and isolated rectangular parallelepipeds are arranged along the column and row-directions. The device isolation films 5 are embedded between the adjacent first or second cell site gate insulators 2 to approximately half the height thereof. Each of the device isolation films 5 is formed into a rectangular ridge sandwiched by the adjacent first or second cell site gate insulators 2, and the rectangular ridge runs along the column-direction. The top surfaces of each of the first to third cell site gate insulators 2 are covered by the first to third inter-electrode dielectrics 4.

The first and second inter-electrode dielectrics 4 are arranged extending to the adjacent cell column. As shown in FIG. 4A, the second upper conductive layer 7 and the second lower conductive layer 3 at the select transistors QSGk and QSGk−1 are electrically connected via the inter-electrode through-holes dug in the second inter-electrode dielectrics 4. Each of the inter-electrode through-holes has narrower width, measured along the column-direction dimension, than the minimum resolvable feature size of the optical photolithography.

It is preferable that the insulating film used as the first to third inter-electrode dielectrics 4 preferably made of high dielectric constant insulating film. Various insulating films can be adopted as "the high dielectric constant insulating film" used for the first to third inter-electrode dielectrics 4. However, with a miniaturized semiconductor memory having a minimum line width of 100 nm or less, a material having a higher relative dielectric constant $\in_r$ than an $SiO_2$ film is preferable due to the coupling capacitance relationship between the first lower conductive layer (floating gate electrode) 3 and the first upper conductive layer (control gate electrode) 7. It is especially preferable that the material is equal to or has an even higher relative dielectric constant $\in_r$ than the relative dielectric constant $\in_r=5-5.5$ obtained with the earlier ONO film. For example, a single layer film made from any one of a strontium oxide (SrO) film with $\in_r=6$, a silicon nitride ($Si_3N_4$) film with $\in_r=7$, an aluminum oxide ($Al_2O_3$) film where $\in_r=8-11$, a magnesium oxide (MgO) film where $\in_r=10$, an yttrium oxide ($Y_2O_3$) film where $\in_r=16-17$, a hafnium oxide ($HfO_2$) film where $\in_r=22-23$, a zirconium oxide ($ZrO_2$) film where $\in_r=22-23$, a tantalum oxide ($Ta_2O_5$) film where $\in_r=25-27$, or a bismuth oxide ($Bi_2O_3$) film where $\in_r=40$, or a composite film embracing at least two of these plural layers thereof may be used. $Ta_2O_5$ and $Bi_2O_3$ show disadvantages in lacking thermal stability at the interface with the polysilicon. Furthermore, it may be a composite film made from a silicon oxide film and these films. The composite film may have a stacked structure of triple-levels or more. In other words, it should be an insulating film containing a material with the relative dielectric constant $\in_r$ of 5–6 or greater in at least a portion thereof. However, in the case of a composite film, selecting a combination that results in having an effective relative dielectric constant $\in_{reff}$ of 7 or greater measured for the entire film is preferred. An effective relative dielectric constant $\in_{reff}$ of less than 5–6 is approximately the same as that of the ONO film, whereby effectiveness greater than with the ONO film cannot be expected. However, the ONO film can also facilitate the establishment of the first to third inter-electrode dielectrics 4 in some cases. Moreover, it may also be an insulating film made from an oxide film of a ternary compound such as a hafnium aluminate (HfAlO) film.

In other words, an oxide containing at least one of the elements: aluminum (Al), magnesium (Mg), yttrium (Y), hafnium (Hf), zirconium (Zr), tantalum (Ta), and bismuth (Bi) may be the insulating film used as the first to third inter-electrode dielectrics 4. It should be noted that ferroelectrics such as strontium titanate ($SrTiO_3$) and barium strontium titanate ($BaSrTiO_3$) are available as the high dielectric constant insulating film material; however, a lack of thermal stability at the interface with the polysilicon and hysteresis characteristics of the ferroelectrics must be considered. It should be noted that the case of using an alumina film as the first to third inter-electrode dielectrics 4 is exemplified in the following description, however, it is apparent from the above description that it is not limited to the alumina film.

In FIGS. 4A, 4B and 4C, refractory metal silicide layers 13 such as cobalt silicide ($CoSi_2$) are formed on the surfaces of the first to third peripheral conductive layers 11, 11d, 11g, and also on source and drain contact windows so as to implement salicide structures. A titanium (Ti) or nickel (Ni) metal silicide may be used instead of the $CoSi_2$ layer 13.

In FIGS. 4A, 4B and 4C, the first to third lower conductive layers (floating gate electrodes) 3 and the first to third upper conductive layers (control gate electrodes) 7 are formed from a polysilicon film doped with n-type impurity atoms such as phosphorous (P) (hereafter referred to as "doped polysilicon"). However, the first to third upper conductive layers (control gate electrodes) 7 are not limited to the doped polysilicon, and may be formed from any one of titanium (Ti), tungsten (C), tungsten nitride (WN) or titanium nitride (TiN, $Ti_2N$), or multiple stacked films thereof. The first conductive layers (control gate electrodes) 7 are connected to the word lines $WL1_k, WL2_k, \ldots, WL32_k$, $WL1_{k-1}, \ldots$, which are made from a tungsten (Ti), aluminum (Al), titanium (Ti) or copper (Cu) metal.

With the semiconductor memory according to the first embodiment, fabricating the first peripheral site gate insulator 10 thinner than the first or second cell site gate insulator 2 is possible, as well as fabricating miniaturized select transistors QSGk and QSGk−1 in the cell column.

A fabrication method of the semiconductor memory according to the first embodiment of is described referencing FIGS. 5A, 5B and 5C to FIGS. 21A, 21B and 21C. It should be noted that the fabrication method of the semiconductor memory given below is merely an example, and other various fabrication methods, including modifications of this fabrication method, may naturally be adopted. FIGS. 5A through 21A, drawing numbers labeled A are cross sectional views taken on line IVA—IVA in FIG. 3, showing part of the memory cell matrix 20 cut along the length of the bit lines $BL_{2j-1}, BL_{2j}, BL_{2j+1}, \ldots$. The drawing numbers labeled A are the cross sectional views showing a connection point of two adjacent cell columns, namely showing both the select transistor QSGk belonging to k-th cell column and the select transistor QSGk−1 belonging to k−1-th cell columns. At the connection point of the select transistors QSGk and QSGk−1, the two adjacent cell columns are folded back each other. FIGS. 5B through 21B, drawing numbers labeled B are schematic cross sectional views taken on line IVB—IVB in FIG. 3, showing part of the memory cell matrix 20 cut along the length of the word lines $WL1_k, WL2_k, \ldots, WL32_k$, $WL1_{k-1}, \ldots$. The drawing numbers labeled B correspond to the cross sectional views cut along the centerline of the inter-electrode through-holes 41 (see FIG. 14A), the centerline running along the row-direction. And, FIGS. 5C through 21C, drawing numbers labeled C are cross sectional views showing the peripheral transistor Qp of the peripheral circuitry 21, 22, 23 and 24.

Figure 5A:
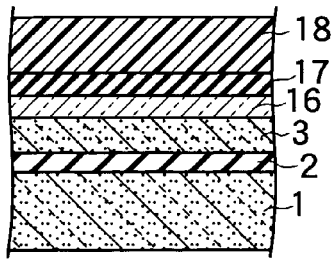
FIG. 5A is a process flow cross sectional view showing a part of the memory cell matrix cut along the column-direction, explaining a manufacturing method of the semiconductor memory according to the first embodiment.
Figure 5B:
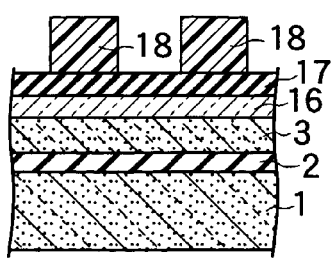
FIG. 5B is a corresponding process flow cross sectional view showing a part of the memory cell matrix cut along the row-direction, explaining the manufacturing method of the semiconductor memory according to the first embodiment.
Figure 5C:
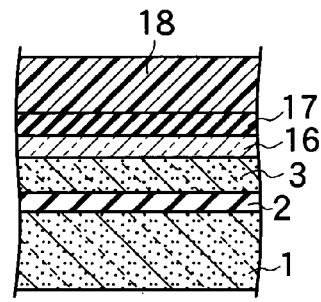
FIG. 5C is a corresponding process flow cross sectional view of a peripheral transistor, cut along the column-direction, explaining the manufacturing method of the semiconductor memory according to the first embodiment.

(a) To begin with, a cell site gate insulator 2 such as a silicon oxide ($SiO_2$) film or the like is formed with a thickness of approximately 1 to 15 nm through thermal oxidation on a semiconductor substrate 1 made from a p-type silicon substrate. Instead of the p-type silicon substrate, an n-type silicon substrate with p-wells formed therein can be adopted for the semiconductor substrate 1 so that the cell site gate insulator 2 can be formed on the p-wells. A lower conductive layer 3, which is a doped polysilicon film doped with n-type impurity atoms such as phosphorous (P), is formed with a thickness of approximately 10 to 200 nm on the cell site gate insulator 2 through chemical vapor deposition (CVD). Next, a silicon nitride ($Si_3N_4$) film 16 is formed with a thickness of approximately 50 to 200 nm on the lower conductive layer (lower doped polysilicon film) 3 by CVD, and a silicon oxide film 17 is then deposited with a thickness of 50 to 400 nm by CVD. Photoresist film 18 is then coated on the silicon oxide film 17, so that the photoresist film 18 can be exposed and developed by photolithography so as to delineate an etching mask as shown in FIGS. 5A, 5B and 5C. Next, the silicon oxide film 17 is selectively etched through reactive ion etching (RIE), using the etching mask made of the photoresist film 18, so as to delineate a new etching mask made of the silicon oxide film 17. The photoresist film 18, employed for the RIE process to delineate the new etching mask made of the silicon oxide film 17, is removed.

Figure 6A:
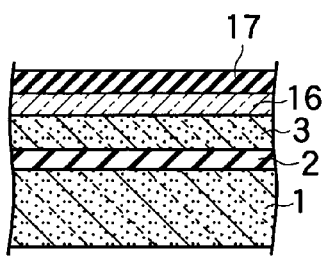
FIG. 6A is a subsequent process flow cross sectional view showing the part of the memory cell matrix of the semiconductor memory according to the first embodiment cut along the column-direction after the process stage shown in FIG. 5A.
Figure 6B:
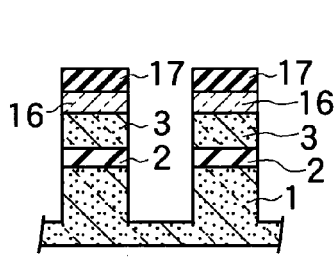
FIG. 6B is a subsequent process flow cross sectional view showing the part of the memory cell matrix cut along the row-direction after the process stage shown in FIG. 5B.
Figure 6C:
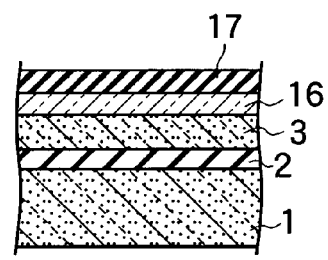
FIG. 6C is a subsequent process flow cross sectional view of a peripheral transistor cut along the column-direction after the process stage shown in FIG. 5C.
Figure 7A:
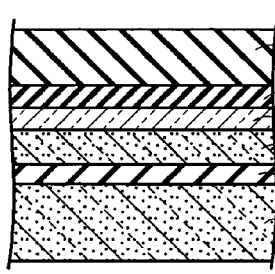
FIG. 7A is a subsequent process flow cross sectional view showing the part of the memory cell matrix of the semiconductor memory according to the first embodiment cut along the column-direction after the process stage shown in FIG. 6A.
Figure 7B:
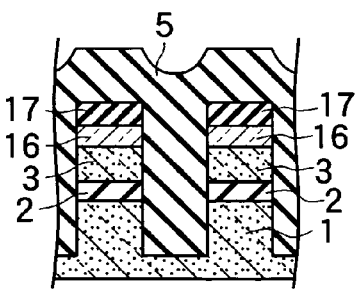
FIG. 7B is a subsequent process flow cross sectional view showing the part of the memory cell matrix cut along the row-direction after the process stage shown in FIG. 6B.
Figure 7C:
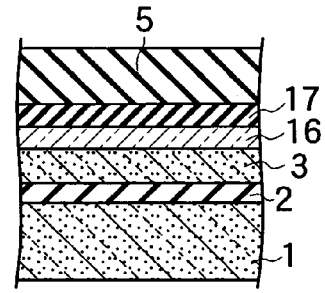
FIG. 7C is a subsequent process flow cross sectional view of a peripheral transistor cut along the column-direction after the process stage shown in FIG. 6C.
Figure 8A:
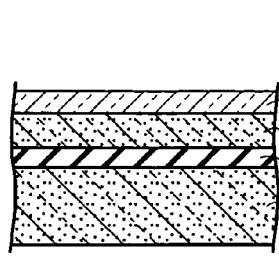
FIG. 8A is a further subsequent process flow cross sectional view showing the part of the memory cell matrix of the semiconductor memory according to the first embodiment cut along the column-direction after the process stage shown in FIG. 7A.
Figure 8B:
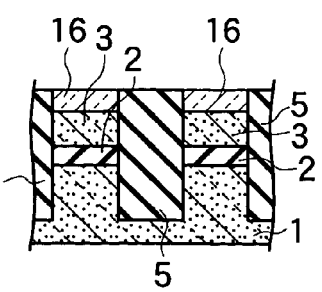
FIG. 8B is a further subsequent process flow cross sectional view showing the part of the memory cell matrix cut along the row-direction after the process stage shown in FIG. 7B.
Figure 8C:
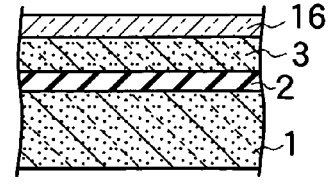
FIG. 8C is a further subsequent process flow cross sectional view of a peripheral transistor cut along the column-direction after the process stage shown in FIG. 7C.
Figure 9A:
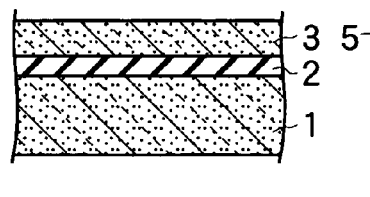
FIG. 9A is a still further subsequent process flow cross sectional view showing the part of the memory cell matrix of the semiconductor memory according to the first embodiment cut along the column-direction after the process stage shown in FIG. 8A.
Figure 9B:
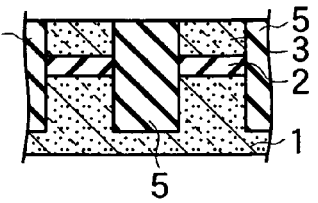
FIG. 9B is a still further subsequent process flow cross sectional view showing the part of the memory cell matrix cut along the row-direction after the process stage shown in FIG. 8B.
Figure 9C:
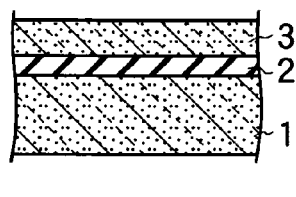
FIG. 9C is a still further subsequent process flow cross sectional view of a peripheral transistor cut along the column-direction after the process stage shown in FIG. 8C.

(b) Subsequently, using the new etching mask made of the silicon oxide film 17, the lower conductive layer 3, the cell site gate insulator 2, and the semiconductor substrate (silicon substrate) 1 are selectively and successively etched by RIE, and a plurality of device-isolation trenches running along the column-direction are formed periodically as shown in FIGS. 6A, 6B and 6C. A device-isolation film 5 made from a silicon oxide film is then formed with a thickness of 200 to 1500 nm, filling in the device-isolation trenches as shown in FIGS. 7A, 7B and 7C. The surface of the device-isolation film 5 is then planarized by chemical mechanical polishing (CMP) until top surfaces of the silicon nitride films 16 are periodically exposed, namely each of the silicon nitride films 16 are employed as a stopper as shown in FIGS. 8A, 8B and 8C. Furthermore, the planarized surface, exposing alternatively stripes of the silicon nitride films 16 and stripes of the device-isolation film 5, is further blanket etched evenly so as to obtain a new planarized surface, exposing alternatively stripes of the lower conductive layer 3 and stripes of the device-isolation film 5 as shown in FIGS. 9A, 9B and 9C. Employing a specific plasma etching, which has same etching rate for the silicon oxide film 17, which is used for the device-isolation films 5, and the silicon nitride films 16 on the first conductive films 3, the uniformly planarized blanket etching can be established, for example.

Figure 10A:
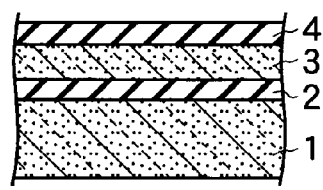
FIG. 10A is a yet still further subsequent process flow cross sectional view showing the part of the memory cell matrix of the semiconductor memory according to the first embodiment cut along the column-direction after the process stage shown in FIG. 9A.
Figure 10B:
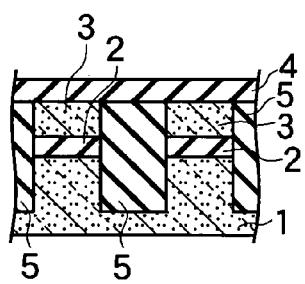
FIG. 10B is a yet still further subsequent process flow cross sectional view showing the part of the memory cell matrix cut along the row-direction after the process stage shown in FIG. 9B.
Figure 10C:
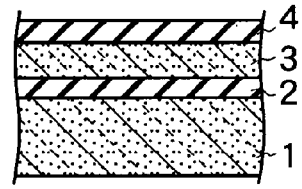
FIG. 10C is a yet still further subsequent process flow cross sectional view of a peripheral transistor cut along the column-direction after the process stage shown in FIG. 9C.

(c) Subsequently, an aluminum oxide ($Al_2O_3$) film, which is a high dielectric constant insulating film, is blanket deposited as the inter-electrode dielectric 4, so as to cover the uniformly planarized surface, exposing alternatively the device-isolation film 5 and the lower conductive layer 3, by low-pressure CVD (LPCVD) as shown in FIGS. 10A, 10B and 10C. By the above mentioned self-alignment methodology, as shown in FIG. 10B, a plurality of the lower conductive layers (floating gate electrodes) 3 are formed between the surrounding device-isolation films 5. It has been omitted from FIG. 10C, however, needless to say, the device-isolation film 5 is also formed in the peripheral site, including the peripheral circuitry 21, 22, 23 and 24, using shallow trench isolation (STI) architecture. By the self-alignment methodology, a plurality of the lower conductive layers (floating gate electrodes) 3 are also formed in the active regions, each of the active regions is defined by surrounding STI region in the peripheral site.

Figure 11A:
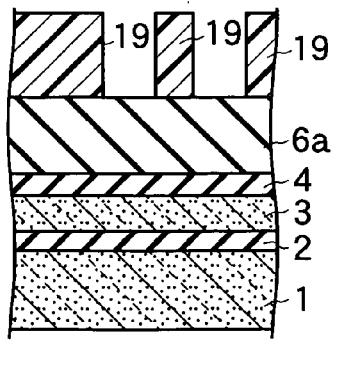
FIG. 11A is a yet still further subsequent process flow cross sectional view showing the part of the memory cell matrix of the semiconductor memory according to the first embodiment cut along the column-direction after the process stage shown in FIG. 10A.
Figure 11B:
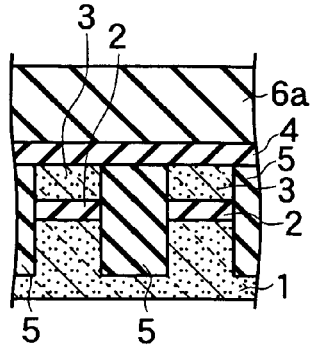
FIG. 11B is a yet still further subsequent process flow cross sectional view showing the part of the memory cell matrix cut along the row-direction after the process stage shown in FIG. 10B.
Figure 11C:
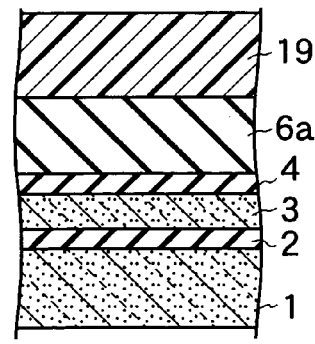
FIG. 11C is a yet still further subsequent process flow cross sectional view of a peripheral transistor cut along the column-direction after the process stage shown in FIG. 10C.
Figure 12A:
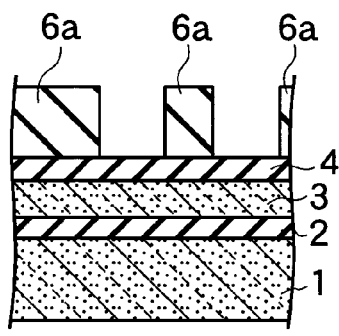
FIG. 12A is a yet still further subsequent process flow cross sectional view showing the part of the memory cell matrix of the semiconductor memory according to the first embodiment cut along the column-direction after the process stage shown in FIG. 11A.
Figure 12B:
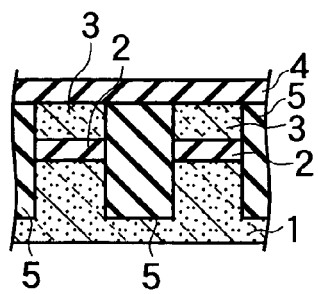
FIG. 12B is a yet still further subsequent process flow cross sectional view showing the part of the memory cell matrix cut along the row-direction after the process stage shown in FIG. 11B.
Figure 12C:
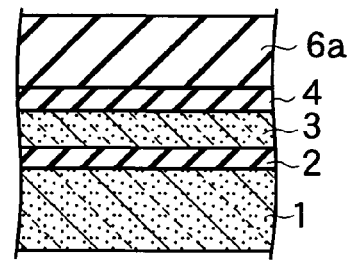
FIG. 12C is a yet still further subsequent process flow cross sectional view of a peripheral transistor cut along the column-direction after the process stage shown in FIG. 11C.
Figure 13A:
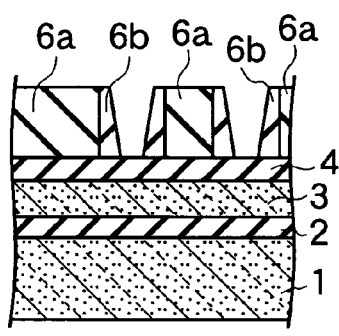
FIG. 13A is a yet still further subsequent process flow cross sectional view showing the part of the memory cell matrix of the semiconductor memory according to the first embodiment cut along the column-direction after the process stage shown in FIG. 12A.
Figure 13B:
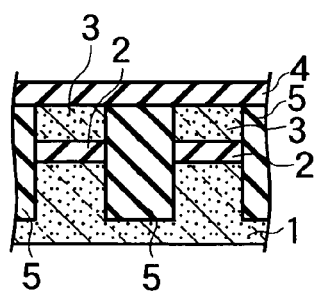
FIG. 13B is a yet still further subsequent process flow cross sectional view showing the part of the memory cell matrix cut along the row-direction after the process stage shown in FIG. 12B.
Figure 13C:
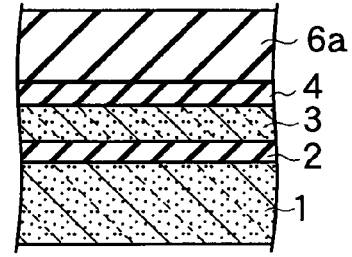
FIG. 13C is a yet still further subsequent process flow cross sectional view of a peripheral transistor cut along the column-direction after the process stage shown in FIG. 12C.

(d) Subsequently, a first tetraethyl orthosilicate (TEOS) film 6a is blanket deposited on the entire top surface. Then, a new photoresist film 19 is coated on the first TEOS film 6a, so that the new photoresist film 19 can be delineated by photolithography so as to form an etching mask as shown in FIGS. 11A, 11B and 11C. Next, the first TEOS film 6a is selectively etched by RIE using the etching mask made of the new photoresist film 19. By the photolithography and RIE, slits running along the row-direction, each of the slits having a width along the column-direction of approximately 200 nm are then formed in the first TEOS film 6a in the regions in which the select transistors QSGk and QSGk-1 are scheduled to be later formed as shown in FIGS. 12A and 12B. By the RIE, the top surfaces of the inter-electrode dielectric 4 positioned respectively at the bottom of the slits are exposed selectively as shown in FIGS. 12A and 12B. The illustration of the sidewall of the slits running along the row-direction at a rearward portion of the paper has been omitted in FIG. 12B. In the periphery circuit site, the first TEOS film 6a remains unetched as shown in FIG. 12C. After the new photoresist film 19 is removed, a second TEOS film 6b is blanket deposited on the patterns of the first TEOS film 6a to a thickness of approximately 60 nm so as to shrink the width of the slits. Next, the second TEOS film 6b is etched by high directivity RIE until top surfaces of the first TEOS film 6a are exposed so as to form sidewalls 6b to the slits opened in the first TEOS film 6a, achieving narrower dimensions of the slits than the minimum resolvable feature size of the optical photolithography, or narrower than the resolution limited by the Rayleigh's criteria of the optics of the photolithography machine such as a stepper, as shown in FIG. 13A. By the high directivity RIE, the top surfaces of the inter-electrode dielectric 4 positioned respectively at the bottom of the slits are also exposed selectively as shown in FIGS. 13A and 13B, removing selectively the second TEOS film 6b at the bottom of the slits. The illustration of the sidewall 6b running along the row-direction at a rearward portion of the paper has been omitted in FIG. 13B. Further, as shown in FIG. 13C, on the first TEOS film 6a in the peripheral site, the second TEOS film 6b is removed.

Figure 14A:
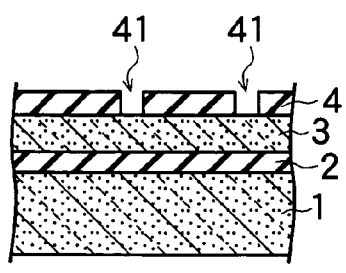
FIG. 14A is a yet still further subsequent process flow cross sectional view showing the part of the memory cell matrix of the semiconductor memory according to the first embodiment cut along the column-direction after the process stage shown in FIG. 13A.
Figure 14B:
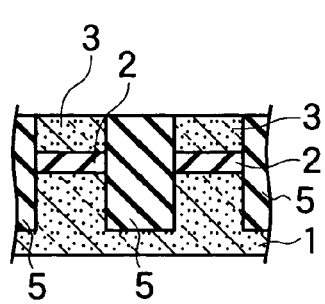
FIG. 14B is a yet still further subsequent process flow cross sectional view showing the part of the memory cell matrix cut along the row-direction after the process stage shown in FIG. 13B.
Figure 14C:
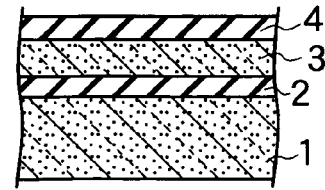
FIG. 14C is a yet still further subsequent process flow cross sectional view of a peripheral transistor cut along the column-direction after the process stage shown in FIG. 13C.

(e) Next, using the shrunk windows, each of which is made of a composite of the first TEOS film 6a and the second TEOS film 6B, as an etching mask, the inter-electrode dielectric ($Al_2O_3$) 4 is etched selectively by RIE so as to form inter-electrode through-holes 41 in respective regions scheduled for forming select transistors, as shown in FIGS. 14A and 14B. If an etchant has a high selectivity for the inter-electrode dielectric 4 relative to silicon or silicon oxide such as boiled phosphoric acid ($H_3PO_4$) solution, the inter-electrode dielectric 4 can be wet etched by the etchant selectively so as to form the inter-electrode through-holes 41. Thereafter, as shown in FIGS. 14A, 14B and 14C, the first TEOS film 16a and the second TEOS film 16b are removed with hydrofluoric acid (HF) solution or the like. FIG. 14B shows one of the bottoms of the slits running along the row-direction in the region scheduled for forming the select transistor, each of the slits having narrower width than the minimum resolvable feature size of the optical photolithography, albeit the illustration of the sidewall of the inter-electrode dielectric 4 running along the row-direction at a rearward portion of the paper has been omitted in FIG. 14B. In the peripheral site, the inter-electrode dielectric 4 blanket covers the top surface of the lower conductive layers (floating gate electrodes) 3 as shown in FIG. 14C.

Figure 15A:
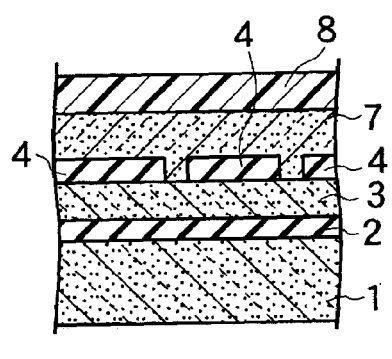
FIG. 15A is a yet still further subsequent process flow cross sectional view showing the part of the memory cell matrix of the semiconductor memory according to the first embodiment cut along the column-direction after the process stage shown in FIG. 14A.
Figure 15B:
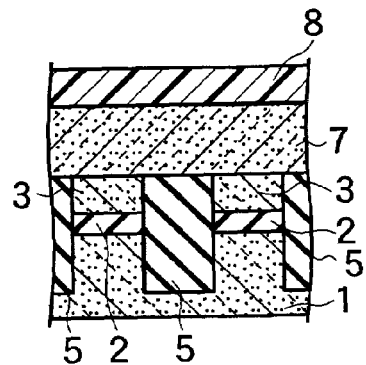
FIG. 15B is a yet still further subsequent process flow cross sectional view showing the part of the memory cell matrix cut along the row-direction after the process stage shown in FIG. 14B.
Figure 15C:
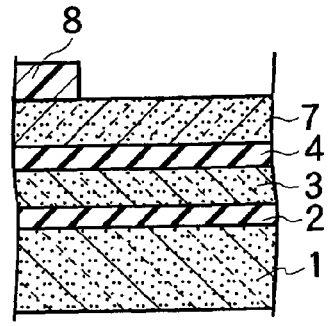
FIG. 15C is a yet still further subsequent process flow cross sectional view of a peripheral transistor cut along the column-direction after the process stage shown in FIG. 14C.

(f) A upper doped polysilicon film, which is adopted for the upper conductive layers (control gate electrodes) 7, is then blanket deposited on the entire top surface of the inter-electrode dielectric 4, covering on the inter-electrode through-holes 41, by CVD. Furthermore, a new photoresist film 8 is coated on the upper doped polysilicon film 7, and by photolithography, a window is made in the new photoresist film 8 in the peripheral site as shown in FIG. 15C. In the memory cell site, top surface of the upper conductive layers (control gate electrodes) 7 is entirely covered by the new photoresist film 8 as shown in FIGS. 15A and 15B.

Figure 16A:
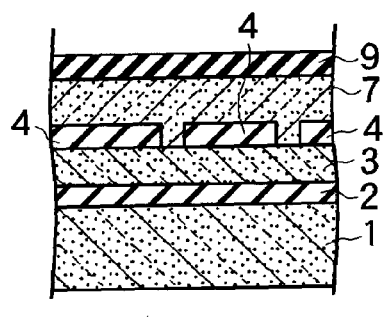
FIG. 16A is a yet still further subsequent process flow cross sectional view showing the part of the memory cell matrix of the semiconductor memory according to the first embodiment cut along the column-direction after the process stage shown in FIG. 15A.
Figure 16B:
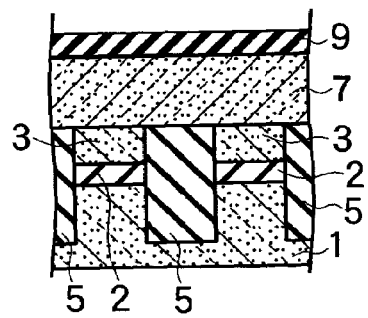
FIG. 16B is a yet still further subsequent process flow cross sectional view showing the part of the memory cell matrix cut along the row-direction after the process stage shown in FIG. 15B.
Figure 16C:
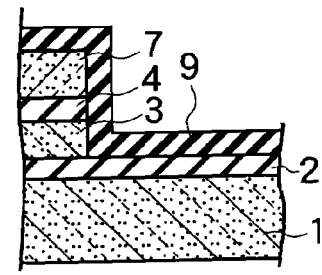
FIG. 16C is a yet still further subsequent process flow cross sectional view of a peripheral transistor cut along the column-direction after the process stage shown in FIG. 15C.

(g) Next, using the new photoresist film 8 as an etching mask, the upper conductive layers (control gate electrodes) 7, the inter-electrode dielectric 4, and the lower conductive layers (floating gate electrodes) 3 in the peripheral site are selectively etched and removed by RIE so as to form a first opening (window), which exposes a portion of the oxide film formed as the cell site gate insulator 2. Subsequently, the new photoresist film 8 is removed, and as shown in FIGS. 16A and 16B, a silicon nitride film 9 is blanket deposited across the entire top surface of upper conductive layers (control gate electrodes) 7 by CVD in the memory cell site. As shown in FIG. 16C, in the peripheral site, the silicon nitride film 9 covers a sidewall of the step, defined between the top surfaces of the upper conductive layers 7 and the cell site gate insulator 2, as well as the top surface of the exposed cell site gate insulator 2 positioned at the bottom of the first opening (window).

Figure 17A:
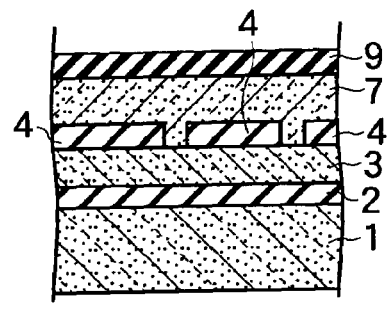
FIG. 17A is a yet still further subsequent process flow cross sectional view showing the part of the memory cell matrix of the semiconductor memory according to the first embodiment cut along the column-direction after the process stage shown in FIG. 16A.
Figure 17B:
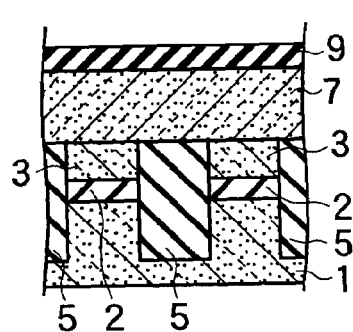
FIG. 17B is a yet still further subsequent process flow cross sectional view showing the part of the memory cell matrix cut along the row-direction after the process stage shown in FIG. 16B.
Figure 17C:
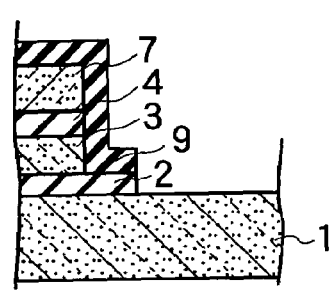
FIG. 17C is a yet still further subsequent process flow cross sectional view of a peripheral transistor cut along the column-direction after the process stage shown in FIG. 16C.

(h) Next, a new photoresist film is coated on the silicon nitride film 9, covering the step in the peripheral site, the step being defined between the top surfaces of the upper conductive layers 7 and the cell site gate insulator 2. Then, a second opening, which is slightly smaller than the first opening, is delineated in the new photoresist film at the peripheral site by photolithography. Using the new photoresist film having the second opening as an etching mask, the silicon nitride film 9 exposed at the bottom of the second opening is selectively etched by RIE so as to expose a portion of the cell site gate insulator 2. Successively, the cell site gate insulator 2, or the oxide film 2, exposed at the bottom of the second opening is selectively etched as shown in FIG. 17C with hydrofluoric acid solution so as to expose a portion of the top surface of the semiconductor substrate 1. As shown in FIGS. 17A and 17B, the silicon nitride film 9 remains on the entire top surface of upper conductive layers (control gate electrodes) 7 in the memory cell site.

Figure 18A:
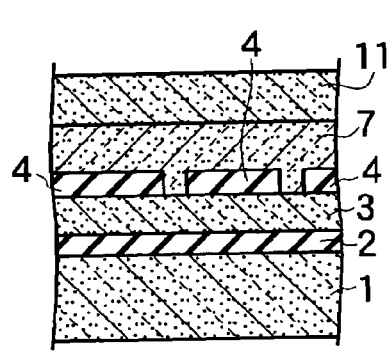
FIG. 18A is a yet still further subsequent process flow cross sectional view showing the part of the memory cell matrix of the semiconductor memory according to the first embodiment cut along the column-direction after the process stage shown in FIG. 17A.
Figure 18B:
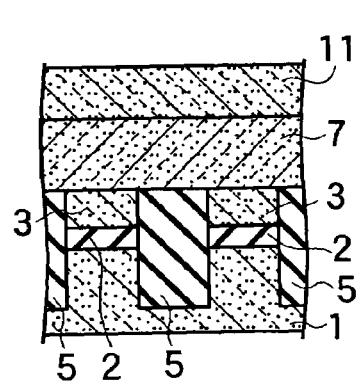
FIG. 18B is a yet still further subsequent process flow cross sectional view showing the part of the memory cell matrix cut along the row-direction after the process stage shown in FIG. 17B.
Figure 18C:
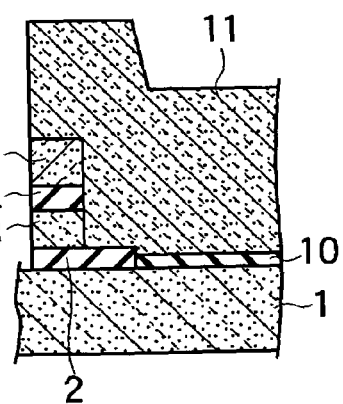
FIG. 18C is a yet still further subsequent process flow cross sectional view of a peripheral transistor cut along the column-direction after the process stage shown in FIG. 17C.

(i) Subsequently, the portion of the top surface of the semiconductor substrate 1 exposed at the bottom of the second opening is thermally oxidized selectively using the silicon nitride film 9 as the oxidation protection mask, forming a new gate oxide film (a peripheral site gate insulator) 10 for the peripheral transistor Qp scheduled at the peripheral site. The silicon nitride film 9, used as the oxidation protection mask, is then removed by wet etching using boiled phosphoric acid solution or the like. Furthermore, as shown in FIGS. 18A, 18B and 18C, an peripheral conductive layer 11, or a top doped polysilicon film 11, which is adopted for the gate electrode of the peripheral transistor Qp in the peripheral site is blanket deposited by CVD. As shown in FIG. 18C, the peripheral conductive layer 11 extending from the top surface of the upper conductive layer 7 to the top surface of the peripheral site gate insulator 10. The peripheral conductive layer 11 covers a step defined between the top surfaces of the upper conductive layer 7 and the peripheral site gate insulator 10. On the inter-electrode dielectric 4, the peripheral conductive layer 11 and the conductive layer 7 are merged into a single layer at an interface portion between the memory cell site and peripheral site.

Figure 19A:
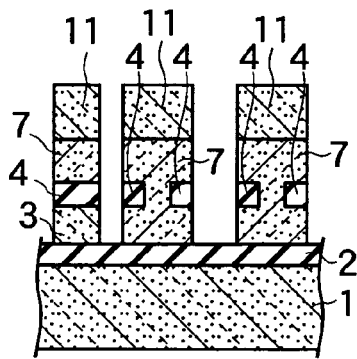
FIG. 19A is a yet still further subsequent process flow cross sectional view showing the part of the memory cell matrix of the semiconductor memory according to the first embodiment cut along the column-direction after the process stage shown in FIG. 18A.
Figure 19B:
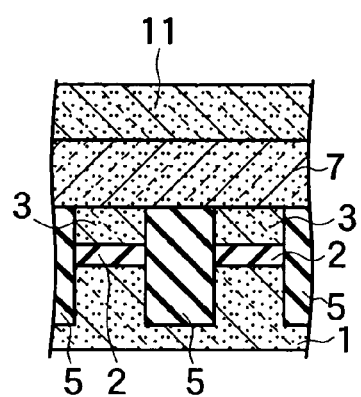
FIG. 19B is a yet still further subsequent process flow cross sectional view showing the part of the memory cell matrix cut along the row-direction after the process stage shown in FIG. 18B.
Figure 19C:
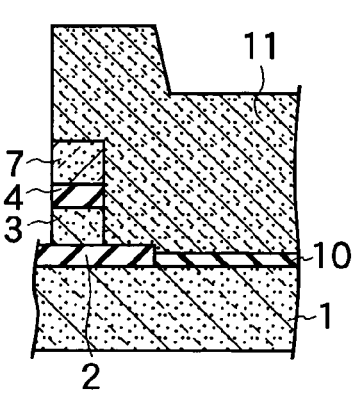
FIG. 19C is a yet still further subsequent process flow cross sectional view of a peripheral transistor cut along the column-direction after the process stage shown in FIG. 18C.

(j) Then, a new photoresist film is coated on the peripheral conductive layer (the top doped polysilicon film) 11. Subsequently, the new photoresist film is delineated by photolithography so as to form an etching mask for dividing into a plurality of memory cell transistors in each of the cell columns in the memory cell matrix 20. In other words, using the new photoresist film as the etching mask, the top doped polysilicon film 11, the upper doped polysilicon film 7, the inter-electrode dielectric 4, and the lower doped polysilicon film 3 in the memory cell matrix 20 are etched by RIE to form a plurality of slits running parallel along the row-direction, or along the length of the word lines, which isolate memory cell transistors and select transistors aligned in each of the memory cells as shown in FIG. 19A, albeit FIGS. 19A, 19B and 19C show the process stage, just after the new photoresist film used as the etching mask is removed, following to the process stage for the division of the memory cell transistors. The shape of the first to third peripheral conductive layers 11, the first to third lower conductive layers (floating gate electrodes) 3 and the first to third upper conductive layers (control gate electrodes) 7 are accordingly determined. That is, the shape of the each of the first lower conductive layers 3 of the memory cell transistors is cut into a topology of a rectangular parallelepiped, and isolated rectangular parallelepipeds are arranged along the column and row-directions. The shape of the each of the first and second upper conductive layers 7 is cut into a ridge running along the row-direction. Similarly, the shape of the each of the first and second peripheral conductive layers 11 is cut into a ridge running along the row-direction. FIG. 19B shows one of the composite layer, implemented by the second peripheral conductive layer 11 and the second upper conductive layer 7, running along the row-direction over two of the select transistors. As shown in FIG. 19A, the second upper conductive layer 7 and the second lower conductive layer 3 at the select transistors are electrically connected via the inter-electrode through-holes 41 in the inter-electrode dielectric 4, and FIG. 19B shows the electrically connecting portions through two of the inter-electrode through-holes 41. However, as shown in FIG. 19C, the shape of the third lower conductive layer 3 at the peripheral site is not always required to be cut into the topology of the rectangular parallelepiped, because the shape of the third lower conductive layer 3 at the peripheral site depends on the design of the respective peripheral circuitry 21, 22, 23 and 24, albeit the third lower conductive layer 3 shown in FIG. 19C is adopted for a dummy gate electrode.

Figure 20A:
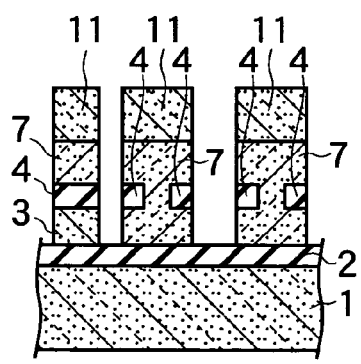
FIG. 20A is a yet still further subsequent process flow cross sectional view showing the part of the memory cell matrix of the semiconductor memory according to the first embodiment cut along the column-direction after the process stage shown in FIG. 19A.
Figure 20B:
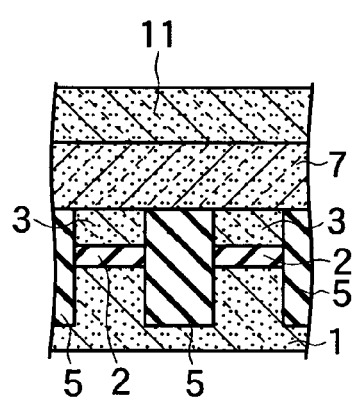
FIG. 20B is a yet still further subsequent process flow cross sectional view showing the part of the memory cell matrix cut along the row-direction after the process stage shown in FIG. 19B.
Figure 20C:
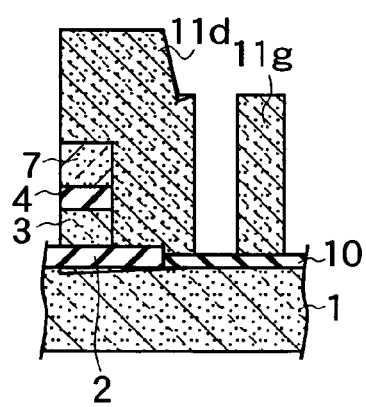
FIG. 20C is a yet still further subsequent process flow cross sectional view of a peripheral transistor cut along the column-direction after the process stage shown in FIG. 19C.

(k) Then, a new photoresist film is coated on the top doped polysilicon film 11, and the new photoresist film is delineated by photolithography for facilitating the establishments of delineation of the peripheral site. Using the new photoresist film as an etching mask, the top doped polysilicon film 11 is selectively etched by RIE so as to expose a portion of the top surface of the gate oxide film (peripheral site gate insulator) 10, forming a groove between the peripheral site and the outermost portion of the memory cell site, as shown in FIG. 20C, albeit FIGS. 20A, 20B and 20C show the process stage after the new photoresist film employed for cutting the groove is already removed. For facilitating the cutting of the groove, the etching condition of the RIE is so elected that the peripheral conductive layer (the top doped polysilicon film) 11 is given sufficient etching rate selectivity relative to the peripheral site gate insulator 10. In the peripheral site, a gate electrode 11g made from the top doped polysilicon film 11 is patterned as shown in FIG. 20C. Once the top doped polysilicon film 11 in the peripheral site is patterned, the new photoresist film used as the etching mask is removed. At this process stage, as shown in FIG. 20C, a dummy gate electrode 11d is also defined in the interface portion between the peripheral site and the memory cell site. The dummy gate electrode 11d implemented by the third peripheral conductive layer 11 extends from the top surface of the third upper conductive layer 7 to the top surface of the second peripheral site gate insulator 10. The dummy gate electrode (peripheral conductive layer) lid covers the step defined between the top surfaces of the third upper conductive layer 7 and the second peripheral site gate insulator 10. On the third inter-electrode dielectric 4, the third peripheral conductive layer 11 and the third upper conductive layer 7 are merged into a single layer. In this way, the dummy gate electrode lid is configured to extend across the interface portion, taking into consideration of the mask misalignment margins in the photolithography step. As shown in FIGS. 20A and 20B, the configuration of the memory cell site remains the same as the configuration shown in FIGS. 19A and 19B.

Figure 21A:
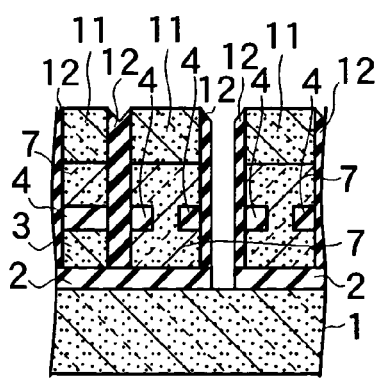
FIG. 21A is a yet still further subsequent process flow cross sectional view showing the part of the memory cell matrix of the semiconductor memory according to the first embodiment cut along the column-direction after the process stage shown in FIG. 20A.
Figure 21B:
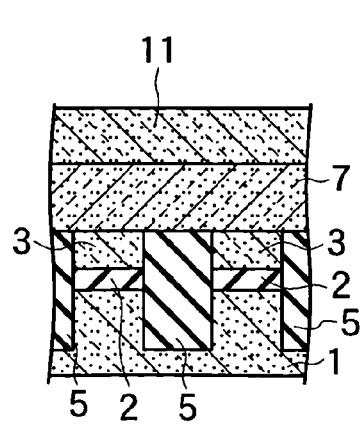
FIG. 21B is a yet still further subsequent process flow cross sectional view showing the part of the memory cell matrix cut along the row-direction after the process stage shown in FIG. 20B.
Figure 21C:
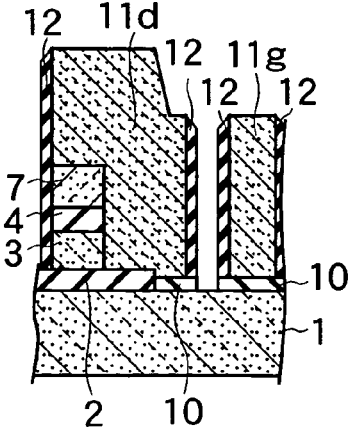
FIG. 21C is a yet still further subsequent process flow cross sectional view of a peripheral transistor cut along the column-direction after the process stage shown in FIG. 20C.

(l) Subsequently, n-type impurity ions such as phosphorus ($^{31}P^+$) ions or arsenic ($^{75}As^+$) ions are selectively implanted into the p-type semiconductor substrate 1 through the cell site gate insulator 2 exposed at the bottoms of the slits running parallel along the row-direction so as to form source and drain diffusion regions 31 of the each of memory cell transistors aligned in the memory cell matrix 20, as well as into the p-type semiconductor substrate 1 disposed at the peripheral site through the peripheral site gate insulator 10 so as to form source and drain diffusion regions 32 of n-type peripheral transistor Qp or into an n-well formed in the p-type semiconductor substrate 1 disposed at the peripheral site through peripheral site gate insulator 10 so as to form n-type contact diffusion regions for the n-well. P-type ions such as boron ($^{11}B^+$ or $^{49}BF_2^+$) ions are further selectively implanted into the p-type semiconductor substrate 1 through cell site gate insulator 2 so as to form p-type contact diffusion region for the p-type semiconductor substrate, as well as into the n-well formed in the p-type semiconductor substrate 1 disposed at the peripheral site through the peripheral site gate insulator 10 so as to form source and drain diffusion regions of p-type peripheral transistors Qp or into the p-type semiconductor substrate 1 disposed at the peripheral site through the peripheral site gate insulator 10 so as to form p-type contact diffusion regions for the p-type semiconductor substrate 1. The n-type impurity ions and/or the p-type impurity ions may be implanted with different dose amount for the memory cell site from those for the peripheral site. After rapid thermal anneal (RTA) or flash ramp anneal (FRA) for activating the implanted impurity ions so as to form serially connected memory cell transistors along the column-direction and various peripheral transistors Qp, a silicon nitride film 12 is blanket deposited. Next, the silicon nitride film 12 is etched by high directivity RIE until top surfaces of silicon nitride film 12 are exposed so as to form silicon nitride sidewalls 12 at respective sidewalls of the slits running parallel along the row-direction as shown in FIGS. 21A, 21B and 21C. By the high directivity RIE, contact holes are formed both at the memory cell site and at the peripheral site as shown in FIGS. 21A and 21C. After the contact holes are opened, refractory metal such as cobalt (Co) is blanket deposited by sputtering or vacuum evaporation. By silicidation annealing such as RTA or FRA, cobalt silicide ($CoSi_2$) films 13 are then formed selectively in the contact holes, the structure in which cobalt silicide films are formed in the contact holes is called "cobalt salicides", as shown in FIGS. 4A and 4C. Simultaneously, by the silicidation annealing, on the top surface of the first and second peripheral conductive layers 11, the dummy gate electrode 11d and the gate electrode 11g, the cobalt silicide (CoSi$_2$) films 13 are selectively formed as shown in FIGS. 4A, 4B and 4C. Actually, an interlayer insulating film may be additionally formed by CVD so as to cover the entire top surface, and it goes without saying that an interconnect layer or the like is then formed using a well-known method.

With the fabrication method of the semiconductor memory according to the first embodiment, peripheral site gate insulators 10 thinner than the cell site gate insulator 2 is easily formed, and miniaturized select transistors QSGk and QSGk–1 are also easily fabricated, whereby the fabrication yield is high. Particularly, since the dummy gate electrode lid is provided in the interface region between the peripheral site and the memory cell matrix 20, adverse effects on device characteristics due to mask misalignment in the photolithography step may be controlled.

(Second Embodiment)

Figure 22A:
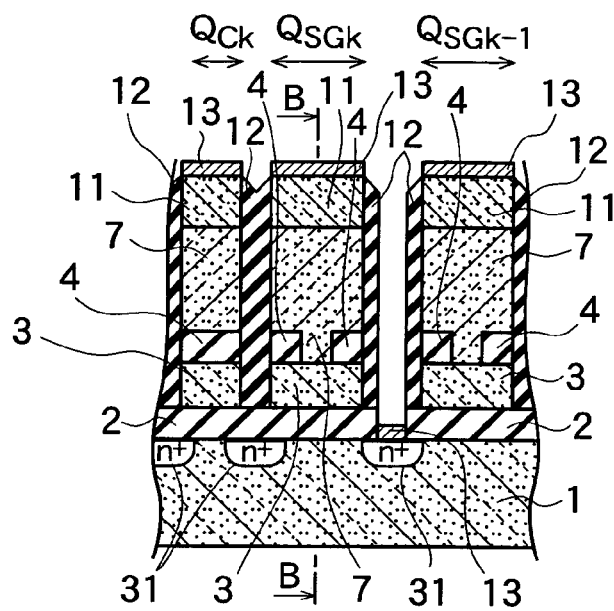
FIG. 22A is a schematic cross sectional view showing a part of the memory cell matrix of a semiconductor memory according to a second embodiment of the present invention, corresponding to the cross sectional view taken on line IVA—IVA in FIG. 3, or the cross sectional view cut along a column-direction.
Figure 22B:
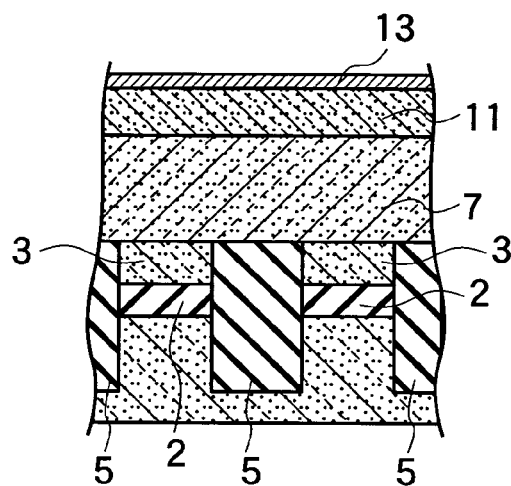
FIG. 22B is a schematic cross sectional view showing a part of the memory cell matrix according to the second embodiment, corresponding to the cross sectional view taken on line IVB—IVB in FIG. 22A, or the cross sectional view cut along a row-direction.
Figure 22C:
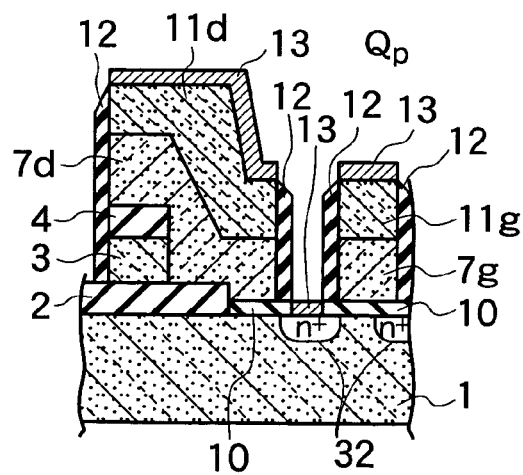
FIG. 22C is a schematic cross sectional view of a peripheral transistor according to the second embodiment, cut along the column-direction.

FIG. 22A is a schematic cross sectional view showing part of the memory cell matrix in a semiconductor memory according to a second embodiment of the present invention, which corresponds to the cross sectional view taken on line IVA—IVA in FIG. 3 in the first embodiment, or the cross sectional view cut along the length of the bit lines BL$_{2j-1}$, BL$_{2j}$, BK$_{2j+1}$, . . . . FIG. 22B corresponds to a schematic cross sectional view showing part of the memory cell matrix taken on line IVB—IVB in FIG. 22A, and is in accordance with the cross sectional view cut along the length of the word lines WL1$_k$, WL2$_k$, . . . , WL32$_k$, WL1$_{k-1}$, . . . . FIG. 22C corresponds to a schematic cross sectional view showing the peripheral transistor Qp of the peripheral circuitry 21, 22, 23 and 24.

Although the plan view is omitted, the semiconductor memory according to a second embodiment of the present invention, as with the semiconductor memory according to the first embodiment, is a NAND flash memory encompassing the memory cell matrix in a memory cell site. Similarly to the first embodiment, the memory cell matrix embraces a plurality of cell columns each made up of serially arranged multiple memory cell transistors along a column-direction and select transistors that select a group of the memory cell transistors arranged in the corresponding cell columns. Furthermore, similarly to the first embodiment shown in FIG. 2, the various peripheral circuitries, which drive the memory cell transistors and the select transistors, and read out information from the memory cell transistors are arranged in a peripheral site.

Furthermore, the configuration of the memory cell transistors QCk according to the second embodiment is similar to the configuration of the memory cell transistors QCk according to the first embodiment. However, the configuration of the memory cell transistors QCk according to the second embodiment differs from the first embodiment in that each of the control gate electrodes of the memory cell transistors QCk is implemented by a double-layer laminated structure embracing a first upper conductive layer 7 and a first top conductive layer 11 disposed on the first upper conductive layer 7 as shown in FIG. 22A. In other words, as shown in FIG. 22A, each of the memory cell transistors QCk of the second embodiment has a first gate electrode structure implemented by a first cell site gate insulator 2, a first lower conductive layer 3, a first inter-electrode dielectric 4, the first upper conductive layer 7, a first top conductive layer 11 and a cobalt silicide (CoSi$_2$) layers 13. The first top conductive layer 11 is directly in contact with the first upper conductive layer 7. The first upper conductive layer 7 is insulated from the first lower conductive layer 3 by the first inter-electrode dielectric 4.

As shown in FIGS. 22A and 22B, corresponding select transistors QSGk and QSGk–1 have a second gate electrode structure, a similar gate electrode structure as the first gate electrode structure of the memory cell transistor QCk. Namely, the second gate electrode structure is implemented by the similar double-layer laminated structure embracing an second upper conductive layer 7 and a second top conductive layer 11 disposed on the second upper conductive layer 7. That is, each of the second gate structures of the select transistors QSGk and QSGk–1 embraces the second cell site gate insulator 2, the second lower conductive layer 3, the second inter-electrode dielectric 4, the second upper conductive layer 7, the second top conductive layer 11 and the cobalt silicide layers 13. Each of the second upper conductive layers 7 is electrically connected to the corresponding second lower conductive layer 3 through a inter-electrode through-hole formed in the second inter-electrode dielectric 4. FIG. 22B shows the schematic cross sectional view cut along the row-direction, or along the centerline of inter-electrode through-hole formed in the second inter-electrode dielectric 4 of the select transistors QSGk. Each of the second top conductive layers 11 is directly in contact with the corresponding second upper conductive layer 7. Because, as shown in FIGS. 22A and 22B, in each of the select transistors QSGk and QSGk–1, the second upper conductive layer 7 is electrically connected to the second lower conductive layer 3 via the inter-electrode through-hole 41 (see FIGS. 27A) in the second inter-electrode dielectric 4, the second top conductive layer 11 is also electrically connected to the second lower conductive layer 3 via the second upper conductive layer 7.

On the other hand, in the peripheral circuitry, a third gate electrode structure of each of the peripheral transistors Qp is implemented by a first peripheral site gate insulator 10 that is thinner than the first or second cell site gate insulator 2, as shown in FIG. 22C. Particularly, as shown in FIG. 22C, the third gate electrode structure stacked on the first peripheral site gate insulator 10 of the peripheral transistors Op according to the second embodiment differs from that of the second embodiment in that the third gate electrode structure is implemented by a double-layer laminated structure (7g, 11g) embracing a lower conductive layer 7g and an upper conductive layer 11g disposed on the lower conductive layer 7g. The configuration of the double-layer laminated structure (7g, 11g) manifests the same structure as the configuration of the control gate electrodes (7, 11) of the memory cell transistor QCk in the memory cell site. As shown in FIG. 22C, the dummy gate electrode (7d, 11d), which is adopted for linking the gate electrode structure of the memory cell transistor to the gate electrode structure of the peripheral transistor Qp, is arranged in an interface region between the memory cell site and the peripheral site. The dummy gate electrode (7d, 11d) facilitates the similar function as the dummy gate electrode of the semiconductor memory according to the second embodiment. The dummy gate electrode (7d, 11d) is also implemented by the double-layer laminated structure, embracing a lower conductive layer 7d and an upper conductive layer 11d disposed on the lower conductive layer 7d. That is, the dummy gate electrode encompasses a third cell site gate insulator 2 having a same thickness as the first cell site gate insulator 2, a second peripheral site gate insulator 10 having a same thickness as the first peripheral site gate insulator 10, a third lower conductive layer 3 disposed on the third cell site gate insulator 2, a third inter-electrode dielectric 4 disposed on the third lower conductive layer 3, a third upper conductive layer 7*d* extending from the top surface of the third inter-electrode dielectric 4 to the top surface of the second peripheral site gate insulator 10, and a third top conductive layer 11*d* disposed on the third upper conductive layer 7*d*. The third upper conductive layer 7*d* covers a step defined between the top surfaces of the third inter-electrode dielectric 4 and the second peripheral site gate insulator 10. The third top conductive layer 11*d* also extends from an upper portion of the third inter-electrode dielectric 4 to an upper portion of the second peripheral site gate insulator 10. In this way, the configuration of the double-layer laminated structure (7*d*, 11*d*) manifests the same structure as the configuration of the first gate structure, or the control gate electrodes (7, 11) of the memory cell transistor QCk in the memory cell site.

Other structure and materials are similar to the structure and materials already explained in the second embodiment, and overlapping or redundant description may be omitted in the second embodiment.

With the semiconductor memory according to the second embodiment, the thickness of the first peripheral site gate insulator 10 can be made thinner than the first or second cell site gate insulator 2, and a miniaturized structure of the select transistors QSGk and QSGk−1 in the cell column can be achieved.

A fabrication method of the semiconductor memory according to the second embodiment is described referencing FIGS. 23A, 23B and 23C to FIG. 31A, 31B and 31C. It should be noted that the fabrication method of the semiconductor memory given below is merely an example, and other various fabrication methods including modifications of the fabrication method may naturally be adopted. As with the fabrication method of the semiconductor memory according to the first embodiment, in each of FIGS. 23A through 31A, or the drawing numbers labeled A are cross sectional views corresponding to the views taken on line IVA—IVA in FIG. 3, showing part of the memory cell matrix 20 cut along the length of the bit lines BL1$_{2j-1}$, BL$_{2j}$, BL$_{2j+1}$, . . . . FIGS. 23B through 31B, or the drawing numbers labeled B are schematic cross sectional views corresponding to the views taken on line IVB—IVB in FIG. 3, showing part of the memory cell matrix 20 cut along the length of the word lines WL1$_k$, WL2$_k$, . . . , WL32$_k$, WL1$_{k-1}$, . . . . And, FIGS. 23C through 31C, or the drawing numbers labeled C are cross sectional views corresponding to the views showing the peripheral transistor Qp of the peripheral circuitry 21, 22, 23 and 24. The drawing numbers labeled A are the cross sectional views showing a connection point of two adjacent cell columns, namely showing both the select transistor QSGk belonging to k-th cell column and the select transistor QSGk−1 belonging to k−1-th cell columns. At the connection point of the select transistors QSGk and QSGk−1, the two adjacent cell columns are folded back each other. The drawing numbers labeled B correspond to the cross sectional views cut along the centerline of the inter-electrode through-holes 41 (see FIG. 27A), the centerline running along the row-direction.

Figure 23A:
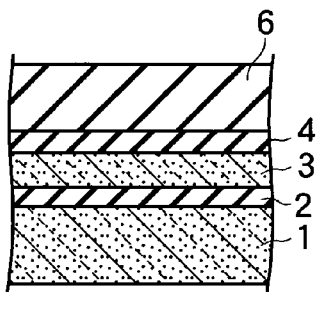
FIG. 23A is a process flow cross sectional view showing a part of the memory cell matrix cut along the column-direction explaining a manufacturing method of the semiconductor memory according to the second embodiment.
Figure 23B:
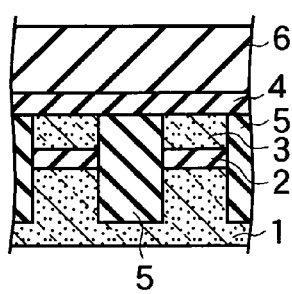
FIG. 23B is a corresponding process flow cross sectional view showing a part of the memory cell matrix cut along the row-direction, explaining the manufacturing method of the semiconductor memory according to the second embodiment.
Figure 23C:
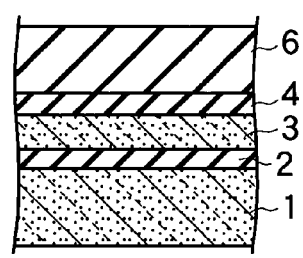
FIG. 23C is a corresponding process flow cross sectional view of a peripheral transistor cut along the column-direction, explaining the manufacturing method of the semiconductor memory according to the second embodiment.

(a) To begin with, the structural cross sectional view of FIGS. 23A, 23B and 23A is obtained by the similar sequence of steps as described in the fabrication method of the semiconductor memory according to the first embodiment. That is, in a memory cell site, a periodic structure implemented by first ridge (5) and second ridge (3, 2, 1), both running alternately along the column-direction is formed. Each of the first ridges is made of device isolation film 5 and each of the second ridges is made of one of protruding portions of a semiconductor substrate 1, a cell site gate insulator 2 on the protruding portion of the semiconductor substrate 1 and a lower conductive layer 3 on the cell site gate insulator 2. Then, as shown in FIG. 23B, the adjacent two cell site gate insulators 2 and the adjacent two doped polysilicon layers 3 are separated by the device-isolation films 5 disposed between the adjacent two cell columns, using STI techniques. An Al$_2$O$_3$ film is then blanket deposited as the inter-electrode dielectric 4 across the entire top surface. Furthermore, the first TEOS film 6 is blanket deposited on the inter-electrode dielectric 4 as shown in FIGS. 23A, 23B and 23C. Although the illustration has been omitted in FIG. 23C, needless to say, the device-isolation films 5 are formed even in the peripheral site for the peripheral circuitry 21, 22, 23 and 24 using STI techniques so as to define a plurality of active areas for the peripheral transistors.

Figure 24A:
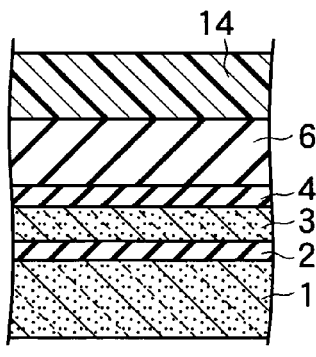
FIG. 24A is a subsequent process flow cross sectional view showing the part of the memory cell matrix of the semiconductor memory according to the second embodiment cut along the column-direction after the process stage shown in FIG. 23A.
Figure 24B:
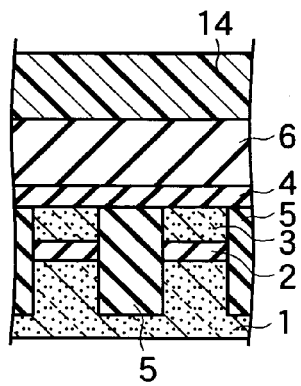
FIG. 24B is a subsequent process flow cross sectional view showing the part of the memory cell matrix cut along the row-direction after the process stage shown in FIG. 23B.
Figure 24C:
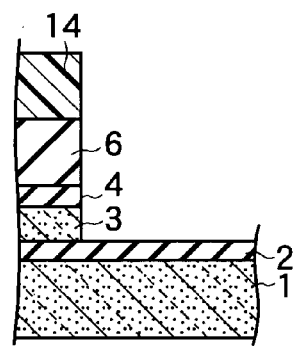
FIG. 24C is a subsequent process flow cross sectional view of a peripheral transistor cut along the column-direction after the process stage shown in FIG. 23C.
Figure 25A:
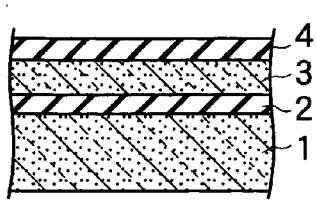
FIG. 25A is a subsequent process flow cross sectional view showing the part of the memory cell matrix of the semiconductor memory according to the second embodiment cut along the column-direction after the process stage shown in FIG. 24A.
Figure 25B:
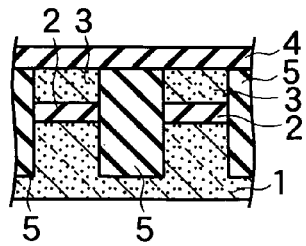
FIG. 25B is a subsequent process flow cross sectional view showing the part of the memory cell matrix cut along the row-direction after the process stage shown in FIG. 24B.

(b) By the photolithography, a photoresist film 14 is delineated so as to form an etching mask 14, and using the etching mask 14, the first TEOS film 6, the inter-electrode dielectric 4, and the lower conductive layer 3 (doped polysilicon film) 3 in the region scheduled for forming the peripheral transistor Qp of the peripheral site are selectively removed by RIE so as to expose a portion of the cell site gate insulator 2, as shown in FIG. 24C. In the memory cell site, the stacked structure of the first TEOS film 6, the inter-electrode dielectric 4, the lower conductive layer 3 and the cell site gate insulator 2 remains unchanged as shown in FIGS. 24A and 25B, because the top surface of the first TEOS film 6 is protected by the etching mask 14.

Figure 25C:
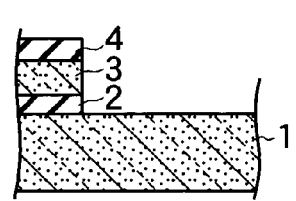
FIG. 25C is a subsequent process flow cross sectional view of a peripheral transistor cut along the column-direction after the process stage shown in FIG. 24C.

(c) Subsequently, the photoresist film 14 used as the etching mask 14 is removed. And as shown in FIGS. 25A and 25B, the first TEOS film 6 on the inter-electrode dielectric 4 is removed by hydrofluoric acid (HF) solution. By the hydrofluoric acid solution, the oxide film 2 exposed at bottom of the opening is simultaneously removed so as to newly expose a portion of the top surface of the semiconductor substrate 1 as shown in FIG. 25C.

Figure 26A:
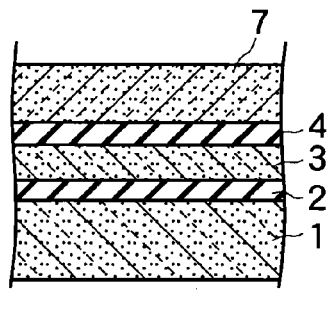
FIG. 26A is a further subsequent process flow cross sectional view showing the part of the memory cell matrix of the semiconductor memory according to the second embodiment cut along the column-direction after the process stage shown in FIG. 25A.
Figure 26B:
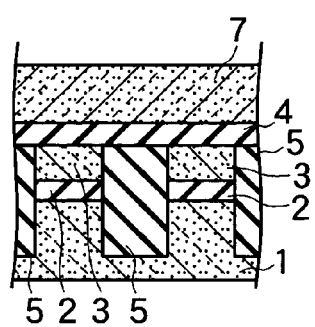
FIG. 26B is a further subsequent process flow cross sectional view showing the part of the memory cell matrix cut along the row-direction after the process stage shown in FIG. 25B.
Figure 26C:
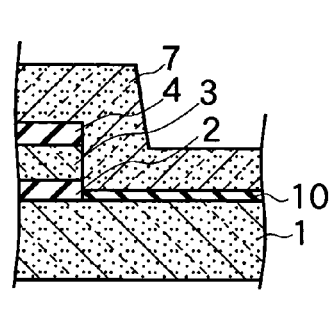
FIG. 26C is a further subsequent process flow cross sectional view of a peripheral transistor cut along the column-direction after the process stage shown in FIG. 25C.

(d) Next, the exposed portion of the top surface of the semiconductor substrate 1 is selectively thermally oxidized, forming the gate oxide film 10 in the peripheral transistor Qp of the peripheral site, as shown in FIG. 26C. Furthermore, as shown in FIGS. 26A, 26B and 26C, the upper doped polysilicon film 7, which is adopted both for the gate electrode of the peripheral transistor Qp in the peripheral site and for the upper conductive layers (control gate electrodes) 7 in the memory cell site, is blanket deposited.

Figure 27A:
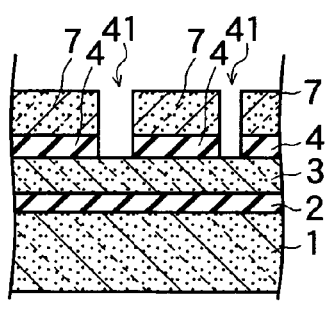
FIG. 27A is a still further subsequent process flow cross sectional view showing the part of the memory cell matrix of the semiconductor memory according to the second embodiment cut along the column-direction after the process stage shown in FIG. 26A.
Figure 27B:
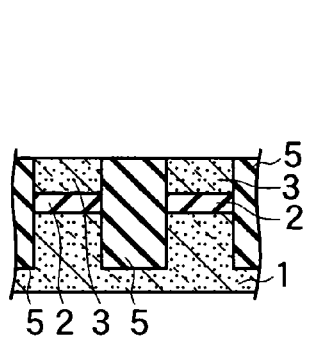
FIG. 27B is a still further subsequent process flow cross sectional view showing the part of the memory cell matrix cut along the row-direction after the process stage shown in FIG. 26B.
Figure 27C:
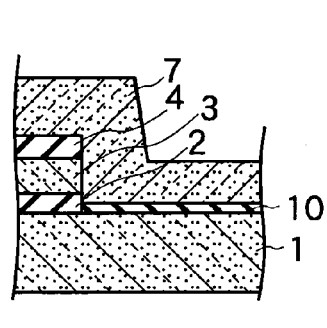
FIG. 27C is a still further subsequent process flow cross sectional view of a peripheral transistor cut along the column-direction after the process stage shown in FIG. 26C.

(e) Subsequently, the second TEOS film (the illustration is omitted in the drawing) is blanket deposited across the entire top surface of the upper doped polysilicon film 7. A new photoresist film is coated on the second TEOS film, and by photolithography, the new photoresist film is delineated. The second TEOS film is selectively etched using the new photoresist film as an etching mask, and then windows are formed with a width of approximately 200 nm in regions in which the select transistors QSGk and QSGk−1 are scheduled to be formed. The new photoresist film is then removed, and a third TEOS film (the illustration is omitted in the drawing) is blanket deposited to a thickness of 60 nm and is selectively etched by RIE, forming sidewalls to the openings—the sequence of the processes is very similar to the sequence along FIGS. 11A, 11B and 11C through FIGS. 13A, 13B and 13C, explained in the fabrication method of the semiconductor memory according to the first embodiment. The upper doped polysilicon film 7 is selectively removed by RIE using the composite of the second and third TEOS films as a shrunk etching mask, achieving narrower dimensions of the slits than the minimum resolvable feature size of the optical photolithography, or narrower than the resolution limited by the Rayleigh's criteria for the optics of the photolithography machine. Furthermore, the inter-electrode dielectric 4 is selectively etched using a method such as with boiled phosphoric acid solution providing a high selectivity relative to silicon and silicon oxide, and the slits for the inter-electrode through-holes 41 are formed in the regions scheduled for forming select transistors as shown in FIG. 27A. The second and third TEOS films are then removed by hydrofluoric acid solution or the like as shown in FIGS. 27A, 27B and 27C. The illustration of the sidewalls of the slits running along the row-direction at a rearward portion of the paper has been omitted in FIG. 27B. In the periphery circuit site, upper doped polysilicon film 7 remains unetched as shown in FIG. 27C.

Figure 28A:
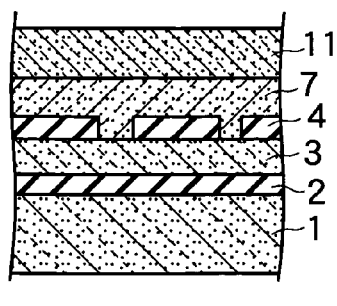
FIG. 28A is a yet still further subsequent process flow cross sectional view showing the part of the memory cell matrix of the semiconductor memory according to the second embodiment cut along the column-direction after the process stage shown in FIG. 27A.
Figure 28B:
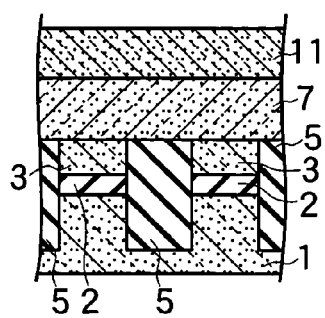
FIG. 28B is a yet still further subsequent process flow cross sectional view showing the part of the memory cell matrix cut along the row-direction after the process stage shown in FIG. 27B.
Figure 28C:
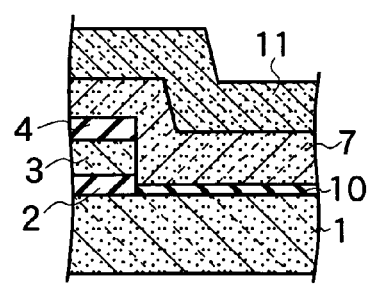
FIG. 28C is a yet still further subsequent process flow cross sectional view of a peripheral transistor cut along the column-direction after the process stage shown in FIG. 27C.

(f) Slight etching with diluted hydrofluoric acid solution is then performed in order to remove a natural oxide film on the upper doped polysilicon film 7, and a top doped polysilicon film 11, which is adopted for both the control gate electrodes of the memory cell transistors QCk in the memory cell site and the peripheral transistor Qp in the peripheral site, is blanket deposited as shown in FIGS. 28A, 28B and 28C.

Figure 29A:
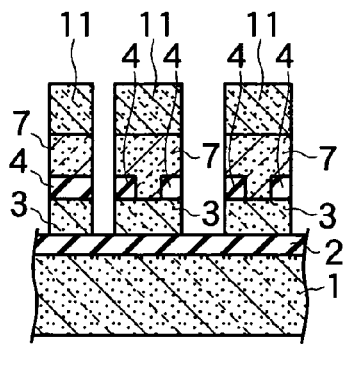
FIG. 29A is a yet still further subsequent process flow cross sectional view showing the part of the memory cell matrix of the semiconductor memory according to the second embodiment cut along the column-direction after the process stage shown in FIG. 28A.
Figure 29B:
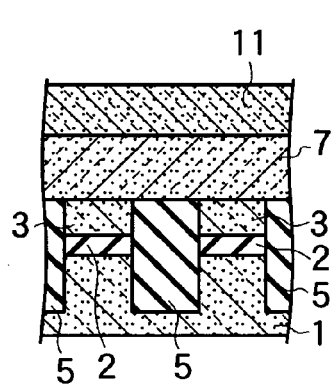
FIG. 29B is a yet still further subsequent process flow cross sectional view showing the part of the memory cell matrix cut along the row-direction after the process stage shown in FIG. 28B.
Figure 29C:
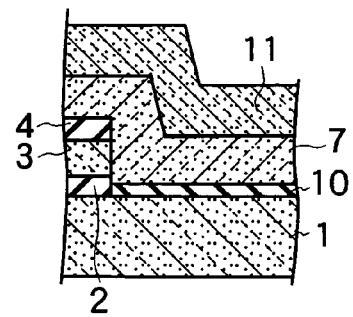
FIG. 29C is a yet still further subsequent process flow cross sectional view of a peripheral transistor cut along the column-direction after the process stage shown in FIG. 28C.

(g) A new photoresist film is then coated on the top doped polysilicon film 11, and the new photoresist film is delineated by photolithography. Using the new photoresist film as an etching mask, the top doped polysilicon film 11, the upper doped polysilicon film 7, the inter-electrode dielectric 4, and the lower doped polysilicon film 3 in the memory cell matrix are etched by RIE, isolating the memory cell transistors QCk in each cell column as shown in FIG. 29A to form a plurality of slits running parallel along the row-direction, or along the length of the word lines, which isolate memory cell transistors and select transistors aligned in each of the memory cells as shown in FIG. 29A, albeit FIGS. 29A, 29B and 29C show the process stage, just after the new photoresist film used as the etching mask is removed following to the process stage for the division of the memory cell transistors. The shape of the top doped polysilicon film 11, the lower conductive layers (floating gate electrodes) 3 and the upper conductive layers (control gate electrodes) 7 are determined accordingly. That is, the shape of the each of the first lower conductive layers 3 of the memory cell transistors is cut into a topology of a rectangular parallelepiped, and isolated rectangular parallelepipeds are arranged along the column and row-directions. The shape of the each of the top doped polysilicon film 11 is cut into a ridge running along the row-direction, and the shape of the each of the first upper conductive layer 7 is also cut into the ridge running along the row-direction. FIG. 29B shows one of the stacked structure of the top doped polysilicon film 11 and the second upper conductive layer 7 running along the row-direction over two of the select transistors. As shown in FIG. 29A, the second upper conductive layer 7 and the second lower conductive layer 3 at the select transistors are electrically connected via the inter-electrode through-holes 41 in the second inter-electrode dielectric 4, and FIG. 29B shows the electrically connecting portions through two of the inter-electrode through-holes 41. In the periphery circuit site, the stacked structure of the top doped polysilicon film 11 and the upper doped polysilicon film 7 remains unetched as shown in FIG. 29C. The shape of the third lower conductive layers 3 at the peripheral site is not always required to be cut into the topology of the rectangular parallelepiped, because the shape of the third lower conductive layers 3 at the peripheral site depends on the design of the respective peripheral circuitry, albeit the third lower conductive layers 3 shown in FIG. 29C is adopted for a dummy transistor. Once the memory cell transistors QCk are isolated in the memory cell site, the new photoresist film used as the etching mask is removed as shown in FIGS. 29A, 29B and 29C.

Figure 30A:
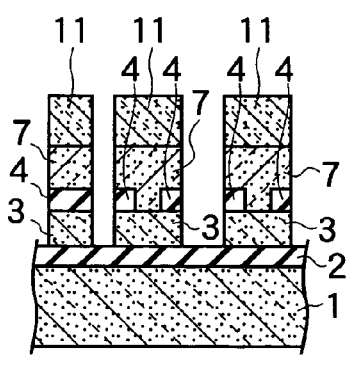
FIG. 30A is a yet still further subsequent process flow cross sectional view showing the part of the memory cell matrix of the semiconductor memory according to the second embodiment cut along the column-direction after the process stage shown in FIG. 29A.
Figure 30B:
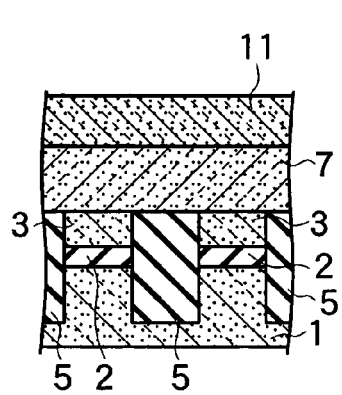
FIG. 30B is a yet still further subsequent process flow cross sectional view showing the part of the memory cell matrix cut along the row-direction after the process stage shown in FIG. 29B.
Figure 30C:
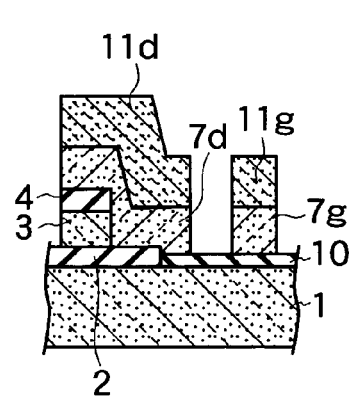
FIG. 30C is a yet still further subsequent process flow cross sectional view of a peripheral transistor cut along the column-direction after the process stage shown in FIG. 29C.

(h) An additional photoresist film is then coated on the top doped polysilicon film 11, and the additional photoresist film is delineated by photolithography. Using the additional photoresist film delineated by photolithography as an etching mask, as shown in FIG. 30C, the stacked structure of the top doped polysilicon film 11 and the upper doped polysilicon film 7 is selectively etched so as to define a gate electrode (11g, 7g) of the peripheral transistor Qp in the peripheral site by RIE. In the RIE, a sufficient etching selectivity relative to the gate oxide film (peripheral site gate insulator) 10 is given to the etching of the top doped polysilicon film 11 and the upper doped polysilicon film 7. At the same time, as shown in FIG. 30C, a dummy gate (11d, 7d) is also defined in the interface portion between the peripheral site and the memory cell site. The dummy gate (11d, 7d) extends across the interface portion, taking into consideration of the patterning misalignment margins in the photolithography step for processing peripheral gates. The additional photoresist film is then removed as shown in FIGS. 30A, 30B and 30C. As shown in FIGS. 30A and 30B, the configuration of the memory cell site remains the same as the configuration shown in FIGS. 29A and 29B.

Figure 31A:
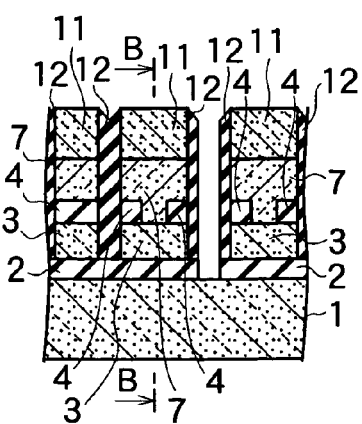
FIG. 31A is a yet still further subsequent process flow cross sectional view showing the part of the memory cell matrix of the semiconductor memory according to the second embodiment cut along the column-direction after the process stage shown in FIG. 30A.
Figure 31B:
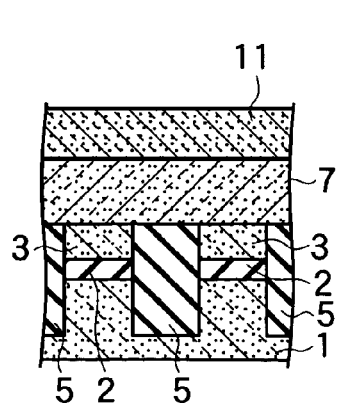
FIG. 31B is a yet still further subsequent process flow cross sectional view showing the part of the memory cell matrix cut along the row-direction after the process stage shown in FIG. 30B.
Figure 31C:
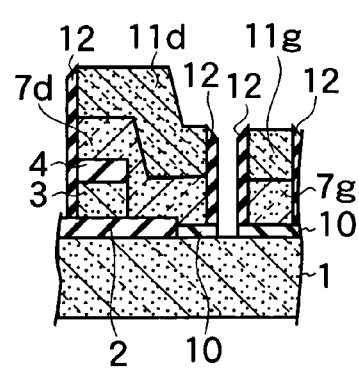
FIG. 31C is a yet still further subsequent process flow cross sectional view of a peripheral transistor cut along the column-direction after the process stage shown in FIG. 30C.

(i) Subsequently, n-type impurity ions such as phosphorus ($^{31}P^+$) ions or arsenic ($^{75}As^+$) ions are selectively implanted into the p-type semiconductor substrate 1 through the cell site gate insulator 2 exposed at the bottoms of the slits running parallel along the row-direction so as to form source and drain diffusion regions 31 of the each of memory cell transistors aligned in the memory cell matrix, as well as into the p-type semiconductor substrate 1 disposed at the peripheral site through the peripheral site gate insulator 10 so as to form source and drain diffusion regions 32 of n-type peripheral transistor Qp or into an n-well formed in the p-type semiconductor substrate 1 disposed at the peripheral site through peripheral site gate insulator 10 so as to form n-type contact diffusion regions for the n-well. P-type ions such as boron ($^{11}B^+$ or $^{49}BF_2^+$) ions are further selectively implanted into the p-type semiconductor substrate 1 through cell site gate insulator 2 so as to form p-type contact diffusion region for the p-type semiconductor substrate, as well as into the n-well formed in the p-type semiconductor substrate 1 disposed at the peripheral site through the peripheral site gate insulator 10 so as to form source and drain diffusion regions of p-type peripheral transistors Qp or into the p-type semiconductor substrate 1 disposed at the peripheral site through the peripheral site gate insulator 10 so as to form p-type contact diffusion regions for the p-type semiconductor substrate 1. The n-type impurity ions and/or the p-type impurity ions may be implanted with different dose amount for the memory cell site from those for the peripheral site. After RTA or FRA for activating the implanted impurity ions so as to form serially connected memory cell transistors along the column-direction and various peripheral transistors Qp, a silicon nitride film 12 is blanket deposited. Next, the silicon nitride film 12 is etched by high directivity RIE until top surfaces of silicon nitride film 12 are exposed so as to form silicon nitride sidewalls 12 at respective sidewalls of the slits running parallel along the row-direction as shown in FIGS. 31A, 31B and 31C. By the high directivity RIE, contact holes are formed both at the memory cell site and at the peripheral site as shown in FIGS. 31A and 31C. After the contact holes are opened, refractory metal such as cobalt (Co) is blanket deposited by sputtering or vacuum evaporation. By silicidation annealing such as RTA or FRA, cobalt silicide ($CoSi_2$) films 13 are then formed selectively in the contact holes, which are called cobalt salicides as shown in FIGS. 22A and 22C. Simultaneously, by the silicidation annealing, on the top surface of the first and second top conductive layer 11, the dummy gate electrode 11d and the gate electrode 11g, the cobalt silicide ($CoSi_2$) films 13 are selectively formed as shown in FIGS. 22A, 22B and 22C. Actually, an interlayer insulating film may be additionally formed by CVD so as to cover the entire top surface, and it goes without saying that an interconnect layer or the like is then formed using a well-known method.

With the fabrication method of the semiconductor memory according to the third embodiment, the peripheral site gate insulator 10 thinner than the cell site gate insulator 2 is easily formed, as well as miniaturized select transistors QSGk and QSGk-1 also being easily fabricated, enabling high fabrication yield. Particularly, since the dummy gates (11d, 7d) are provided in an interface portion between the peripheral site and the memory cell site, disadvantageous affects to device characteristics due to mask misalignment in the photolithography step can be suppressed.

(Other Embodiments)

Various modifications will become possible for those skilled in the art after receiving the teaching of the present disclosure without departing from the scope thereof.

It should be noted that the semiconductor memory or the fabrication method thereof according to the first and second embodiments is not limited to the NAND flash memory shown in FIGS. 2 and 3, and is naturally applicable to various nonvolatile memories, such as NOR flash memory, DINOR flash memory, AND flash memory, each of the nonvolatile memories encompasses one or more transistors having floating gates serving as the electric charge accumulating layers. One of the examples of the nonvolatile memories is AND flash memory, of which the equivalent circuit is given in FIG. 32.

Figure 32:
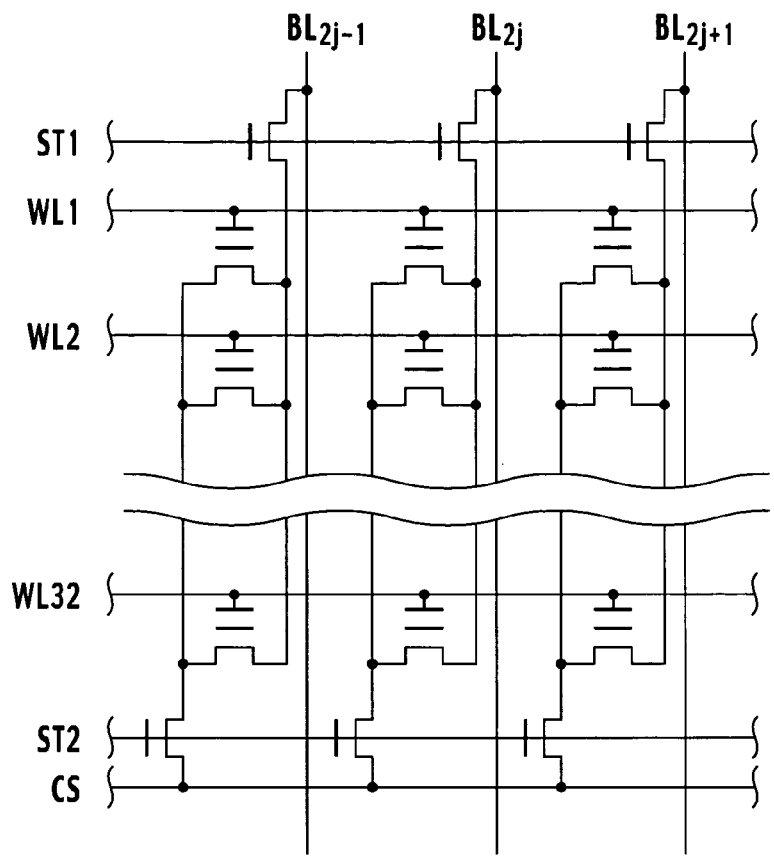
FIG. 32 is an equivalent circuit illustrating a memory cell matrix of the semiconductor memory according to another embodiment of the present invention.

In the AND flash memory, memory cell transistors QCk sharing the same gate constitute the word lines WL1, WL2, ..., WL32, ... arranged along the horizontal direction. And memory cell transistors QCk sharing the same drain electrode and same source electrode constitute bit lines $BL_{2j-1}$, $BL_{2j}$, $BL_{2j-1}$, ... arranged along the vertical direction, orthogonal to these word lines WL1, WL2, ..., WL32, .... FIG. 32 illustrates the case where 32 memory cell transistors Qck are arranged along the column-direction so as to implement each of the cell columns. Pairs of select transistors, which select a group of memory cell transistors QCk serially arranged in the cell column, are arranged at both ends of the cell column array. The plural cell columns are arranged in parallel, close to each other. Upper select gate line ST1 is connected to the respective gates of upper select transistors. Lower select gate line ST2 is connected to the respective gates of the lower select transistors.

The drain electrode of the upper select transistors are connected to the corresponding bit lines $BL_{2j-1}$, $BL_{2j}$, $BL_{2j+1}$, ... The source electrode of the upper select transistors are connected to the drain electrodes of memory cell transistors QCk constituting the corresponding cell columns. The drain electrode of the lower select transistors are connected to the source electrodes of memory cell transistors QCk constituting the corresponding cell columns, and the source electrode of the lower select transistors are connected to the common source line CS. As will be appreciated, the terms drain and source can be exchanged without modifying the structure itself. The structure and materials of the memory cell transistors QCk are similar to the structure and materials already explained in the NAND flash memory, and overlapping or redundant description may be omitted in the AND flash memory.

Figure 33:
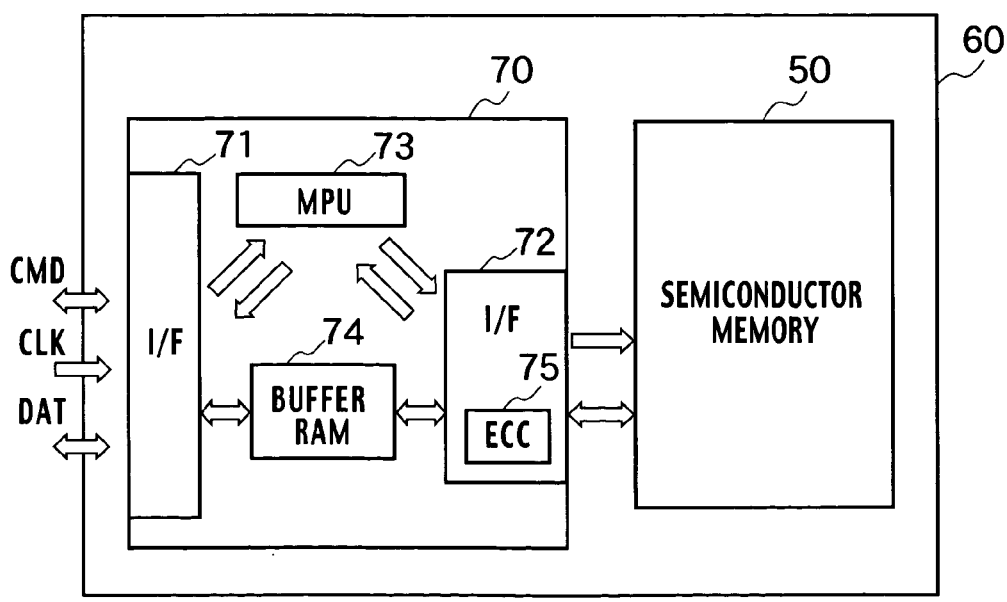
FIG. 33 is an illustrative block diagram showing the internal configuration of a memory card showing an application of the semiconductor memory according to the first or second embodiment of the present invention.

Furthermore, the semiconductor memory according to the first and second embodiments of the present invention allows various application examples. For example, as shown in FIG. 33, the semiconductor memory according to the first or second embodiment is applicable as a semiconductor memory 50 to a memory card 60. The memory card 60 in FIG. 33 embraces, in addition to the already described semiconductor memory 50, a controller 70, which controls the semiconductor memory 50 and receives/transmits a predetermined signal from/to an external device. The controller 70 has interface (I/F) units 71 and 72, a microprocessor unit WMPU) 73, buffer RAM 74, and an error correction code unit (ECC) 75 included in the I/F unit 72. The I/F unit 71 receives/transmits a predetermined signal from/to an external device, and the I/F unit 72 receives/transmits a predetermined signal from/to the semiconductor memory 50. The MPU 73 converts a logical address to a physical address. The buffer RAM 74 temporarily stores data. The ECC 75 generates an error correction code. A command signal line CMD, a clock signal line CLK, and a signal line DAT are connected to the memory card 60. The number of control signal lines, bit width of the signal line DAT, and circuitry of the controller 76 may be modified if needed.

Figure 34:
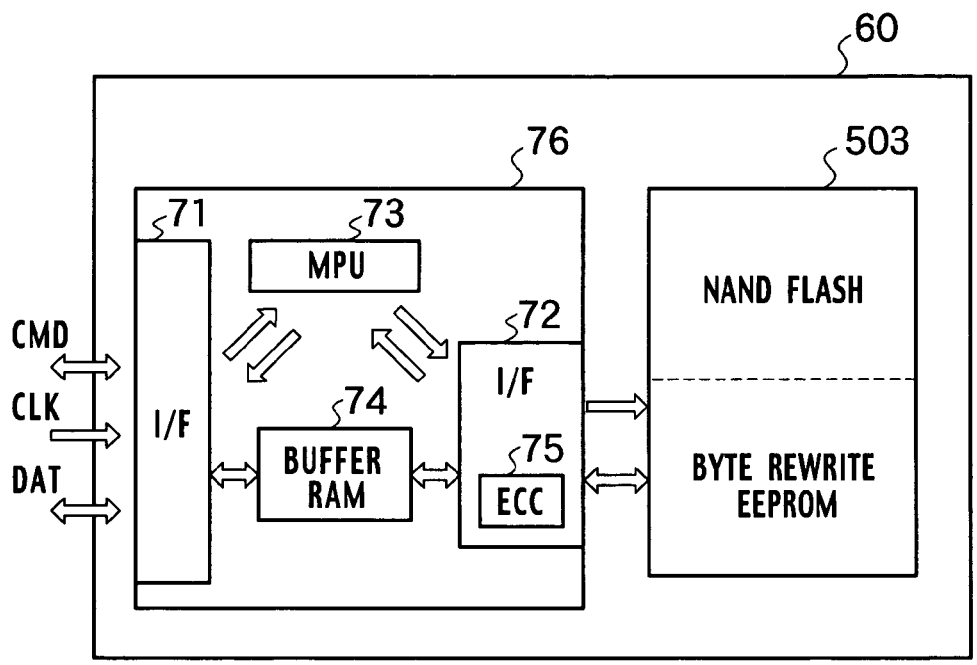
FIG. 34 is an illustrative block diagram showing the internal configuration of another memory card showing another application of the semiconductor memory according to the first or second embodiment of the present invention.

Furthermore, as shown in FIG. 34, EEPROM mode flash memory 503 having ROM regions implemented by a NAND flash memory and a byte rewrite EEPROM, may be utilized to accomplish the memory card 60. NAND flash memory has the semiconductor memory structure described in the first or second embodiment. It is possible to establish a system LSI chip by forming the flash memory 503 shown in FIG. 34 in the same chip as the controller 76 and integrating them onto a single chip. In addition, it is possible to provide a memory mixed MPU by forming a semiconductor memory region implemented by the ROM region included EEPROM mode flash memory 503 in the MPU 73, and to establish a single chip or a system LSI chip by integrating all of the I/F units 71 and 72 and buffer RAM 74.

Figure 35:
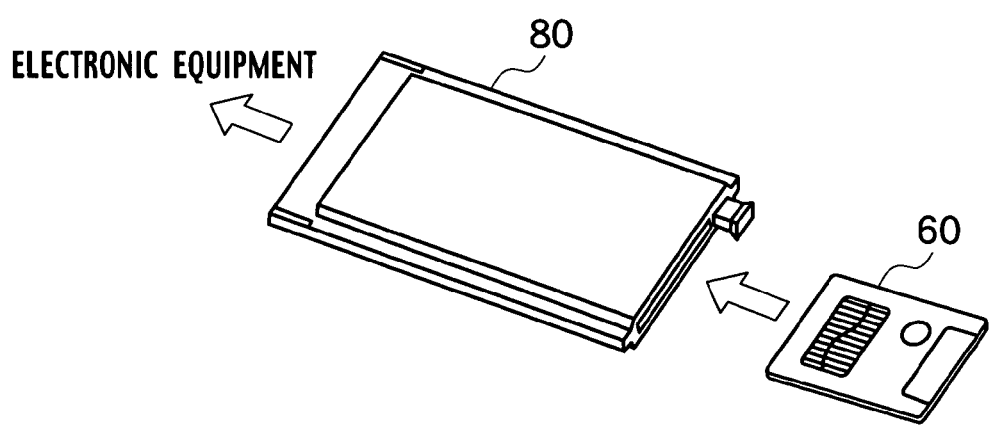
FIG. 35 is a schematic block diagram of a memory card and a cardholder showing still another application of the semiconductor memory according to the first or second embodiment of the present invention.
Figure 36:
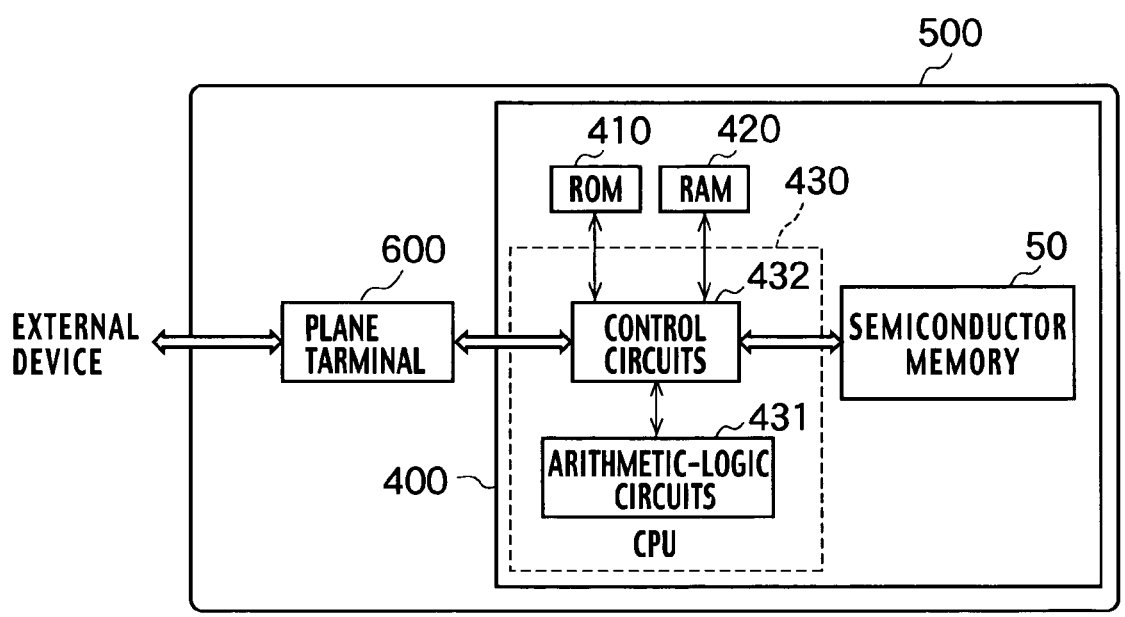
FIG. 36 is an illustrative block diagram showing the internal configuration of an IC card showing yet still another application of the semiconductor memory according to the first or second embodiment of the present invention.

The memory card 60 shown in FIG. 33 and FIG. 34 may be held and utilized in a memory cardholder 80 as shown in FIG. 35. The memory cardholder 80 is connected to an electronic device (the illustration is omitted from the drawing), and is operable as an interface between the memory card 60 and the electronic device. The memory cardholder 80 is capable of executing various functions such as those of the controller 76, MPU 73, buffer RAM 74, ECC 75, and I/F units 71 and 72 in the memory card 60 disclosed in FIG. 33 and FIG. 34. Alternatively, as shown in FIG. 36, a configuration of an IC card 500, which embraces an MPU 400 implemented by the semiconductor memory 50, a ROM 410, a RAM 420 and a CPU 430, and a plane terminal 600, is possible. The IC card 500 can be connected to an external device via the plane terminal 600. In addition, the plane terminal 600 is coupled to the MPU 400 in the IC card 500. The CPU 430 embraces arithmetic-logic circuits 431 and control circuits 432. The control circuits 432 are coupled to the semiconductor memory 50, ROM 410, and RAM 420. It is desirable that the MPU 400 is molded onto one of the surfaces of the IC card 500, and the plane terminal 600 be formed on the other surface of the IC card 500. Alternatively, it is possible to establish a single chip or a system LSI chip by integrating all of ROM 410, RAM 420, the CPU 430, and the semiconductor memory region, and merge such a system LSI chip within the IC card 500. Furthermore, it may have the structure of ROM region included EEPROM mode flash memory with an embedded ROM 410 in the semiconductor memory region, and accomplish a single chip or a system LSI chip integrating all of the ROM region included EEPROM mode flash memory, RAM 420, and the CPU 430.

Figure 37:
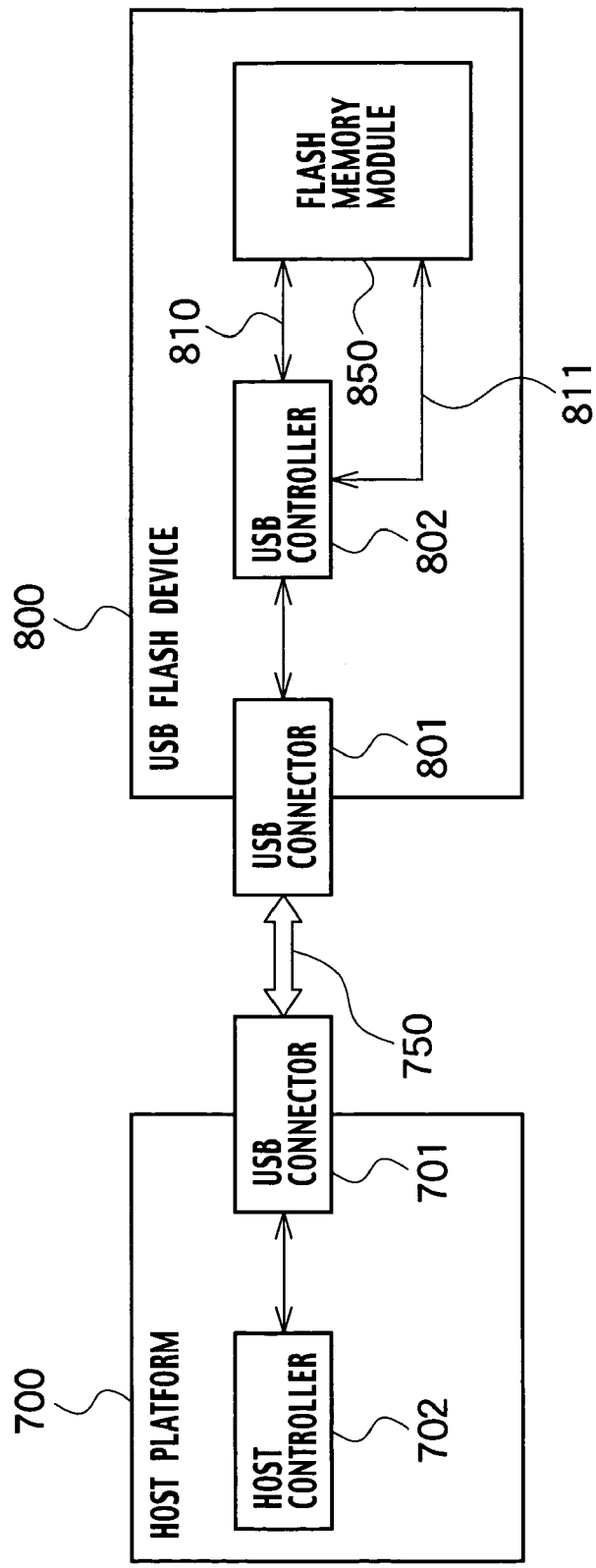
FIG. 37 is a schematic block diagram showing a structure in the case where the semiconductor memory according to the first or second embodiment of the present invention is adopted for a flash memory system.

Furthermore, the nonvolatile semiconductor memory system according to the first to the third embodiment of the present invention is applicable to a universal serial bus (referred to as "USB" hereafter) flash device 800 as shown in FIG. 37. The flash memory system shown in FIG. 37 is implemented by a host platform 700 and the USB flash device 800. The host platform 700 is connected to the USB flash device 800 via a USB cable 750. The host platform 700 is connected to the USB cable 750 via a USB connector 701, and the USB flash device 800 is connected to the USB cable 750 via a USB connector 801. The host platform 700 has a USB host controller 702, which controls packet transmission through a USB bus. The USB flash device 800 encompasses a USB controller 802, which controls other elements in the USB flash device 800 as well as controls the interface with the USB bus for the USB flash device 800; the USB connector 801; and a flash memory module 850, which is implemented by at least one semiconductor memory described in the first to third embodiments of the present invention.

When the USB flash device 800 is connected to the host platform 700, standard USB enumeration processing begins. In the processing, the host platform 700 recognizes the USB flash device 800, selects a mode for transmission therewith, and performs reception/transmission of data from/to the USB flash device 800 via a FIFO buffer called an end point, which stores transfer data. The host platform 700 recognizes changes in the physical and electrical states such as removal/attachment of the USB flash device 800 via another end point, and receives any existing to-be-received packets. The host platform 700 requests services from the USB flash device 800 by sending a request packet to the USB host controller 702. The USB host controller 702 transmits the packet to the USB cable 750. If the USB flash device 800 is the unit with the end point that has received the request packet, the USB controller 802 accepts the request.

Next, the USB controller 802 performs various operations such as read-out, write-in or erasure of data from or to the flash memory module 850. In addition, it supports basic USB functions such as acquiring a USB address and the like. The USB controller 802 controls the flash memory module 850 via either a control line 810, which is used to control output from the flash memory module 850, or, for example, other various signals such as /CE, a read-out signal or a write-in signal. Furthermore, the flash memory module 850 is also connected to the USB controller 802 via an address data bus 811. The address data bus 811 transfers read-out, write-in or erasure commands for the flash memory module 850, and the address and data for the flash memory module 850.

In order to notify the host platform 700 of the result and status of the various operations requested by the host platform 700, the USB flash device 800 transmits a status packet using a status end point (end point 0). In the processing, the host platform 700 checks (polls) for the existence of a status packet, and the USB flash device 800 returns an empty packet or a status packet in the case where there is no packet for a new status message. As described thus far, applying the flash memory module 850, which is implemented by at least one semiconductor memory described in the first to third embodiments of the present invention, allows implementation of various functions of the USB flash unit. Directly connecting the connectors is also possible, by omitting the USB cable described above.

Thus, the present invention of course encompasses various embodiments and modifications and the like which are not detailed above. Therefore, the scope of the present invention will be defined in the following claims.

What is claimed is:

1. A semiconductor memory having a memory cell site and a peripheral site disposed around the memory cell site, the semiconductor memory comprising:
   a memory cell matrix disposed in the memory cell site, including a plurality of cell columns arranged along a row-direction, each of cell columns is implemented by:
      a plurality of memory cell transistors serially connected along a column direction, each of the memory cell transistors having a first gate structure comprising a first cell site gate insulator, a first lower conductive layer disposed on the first cell site gate insulator, a first inter-electrode dielectric disposed on the first lower conductive layer, and a first upper conductive layer disposed on the first inter-electrode dielectric so that the first upper conductive layer is isolated from the first lower conductive layer by the first inter-electrode dielectric; and
      a select transistor arranged along the column-direction, configured to select the memory cell transistors arranged in the cell column, the select transistor having a second gate structure comprising a second cell site gate insulator having a same thickness as the first cell site gate insulator, a second lower conductive layer disposed on the second cell site gate insulator, a second inter-electrode dielectric disposed on the second lower conductive layer, and a second upper conductive layer disposed on the second inter-electrode dielectric so that the second upper conductive layer is conducted with the second lower conductive layer by an inter-electrode through-hole formed in the second inter-electrode dielectric; and
   peripheral circuitry disposed in the peripheral site, configured to drive the memory cell transistors and select transistors and to read information from the memory cell transistors, each of the peripheral circuitry is implemented by peripheral transistors, each of the peripheral transistors having a third gate structure comprising a first peripheral site gate insulator having a thickness thinner than the first cell site gate insulator.

2. The semiconductor memory of claim 1, wherein the thickness of the second lower conductive layer, the second inter-electrode dielectric and the second upper conductive layer are same as the thickness of the first lower conductive layer, the first inter-electrode dielectric and the first upper conductive layer, respectively.

3. The semiconductor memory of claim 2, further comprising:
   a first top conductive layer disposed on the first upper conductive layer,
   a second top conductive layer disposed on the first upper conductive layer, the second top conductive layer having the same thickness as the first top conductive layer, and
   a double-layer laminated structure disposed on the first peripheral site gate insulator, the double-layer laminated structure being implemented by the same configuration of double-layer made of the first upper and top conductive layers.

4. The semiconductor memory of claim 1, further comprising a dummy gate electrode disposed at an interface portion between the memory cell site and the peripheral site, the dummy gate electrode comprising:
a third cell site gate insulator having a same thickness as the first cell site gate insulator;
a second peripheral site gate insulator having a same thickness as the first peripheral site gate insulator;
a third lower conductive layer disposed on the third cell site gate insulator;
a third inter-electrode dielectric disposed on the third lower conductive layer;
a third upper conductive layer disposed on the third inter-electrode dielectric; and
a peripheral conductive layer extending from the top surface of the third upper conductive layer to the top surface of the second peripheral site gate insulator so as to cover a step defined between the top surfaces of the third upper conductive layer and the second peripheral site gate insulator.

5. The semiconductor memory of claim 3, further comprising a dummy gate electrode disposed at an interface portion between the memory cell site and the peripheral site, the dummy gate electrode comprising:
a third cell site gate insulator having a same thickness as the first cell site gate insulator;
a second peripheral site gate insulator having a same thickness as the first peripheral site gate insulator;
a third lower conductive layer disposed on the third cell site gate insulator;
a third inter-electrode dielectric disposed on the third lower conductive layer;
a third upper conductive layer extending from the top surface of the third inter-electrode dielectric to the top surface of the second peripheral site gate insulator so as to cover a step defined between the top surfaces of the third inter-electrode dielectric and the second peripheral site gate insulator; and
a third top conductive layer disposed on the third upper conductive layer, extending from an upper portion of the third inter-electrode dielectric to an upper portion of the second peripheral site gate insulator.

6. The semiconductor memory of claim 1, further comprising a plurality of device isolation films running along the column direction, arranged alternatively between the cell columns so as to isolate adjacent two of the first lower conductive layers by one of the device isolation films sandwiched in between the adjacent two of the first lower conductive layers.

7. The semiconductor memory of claim 1, wherein a plurality of the first upper conductive layers run along the row-direction, each of the first upper conductive layers arranged on the inter-electrode dielectric and the device isolation films so that the first upper conductive layer can be shared by the memory cell transistors arranged along the row-direction belonging to different cell columns.

8. The semiconductor memory of claim 1, wherein each of the first peripheral site gate insulator is a single layer film selected from the group consisting of an silicon oxide film, a silicon nitride film, an aluminum oxide film, a hafnium oxide film and a zirconium oxide film or a composite film including at least one of the single layer film.

9. The semiconductor memory of claim 1, wherein each of the first inter-electrode dielectrics is a single layer film selected from the group consisting of an silicon oxide film, a silicon nitride film, an aluminum oxide film, a hafnium oxide film and a zirconium oxide film or a composite film including at least one of the single layer film.

10. The semiconductor memory of claim 1, wherein each of the first lower conductive layers and the first upper conductive layers is made of polysilicon.

11. The semiconductor memory of claim 1, further comprising a metallic layer disposed on the first upper conductive layer, the metallic layer is selected from the group consisting of titanium silicide, cobalt silicide and nickel silicide.

12. The semiconductor memory of claim 3, further comprising a metallic layer disposed on the first top conductive layer, the metallic layer is selected from the group consisting of titanium silicide, cobalt silicide and nickel silicide.

13. The semiconductor memory of claim 1, further comprising a metallic layer disposed on the first upper conductive layer, the metallic layer is selected from the group consisting of titanium, tungsten, tungsten nitride and titanium nitride.

14. The semiconductor memory of claim 3, further comprising a metallic layer disposed on the first top conductive layer, the metallic layer is selected from the group consisting of titanium, tungsten, tungsten nitride and titanium nitride.

15. The semiconductor memory of claim 7, further comprising a plurality of metallic wirings electrically connected to corresponding first upper conductive layers respectively, the metallic layer includes a material selected from the group consisting of tungsten, aluminum, titanium and cupper.

16. The semiconductor memory of claim 1, wherein the memory cell transistors are connected in NAND topology.

17. The semiconductor memory of claim 1, wherein the memory cell transistors are connected in AND topology.

* * * * *